(12) United States Patent
Saitoh et al.

(10) Patent No.: US 8,994,087 B2
(45) Date of Patent: Mar. 31, 2015

(54) SEMICONDUCTOR DEVICE AND METHOD FOR MANUFACTURING THE SAME

(71) Applicant: Kabushiki Kaisha Toshiba, Tokyo (JP)

(72) Inventors: Masumi Saitoh, Kanagawa-ken (JP); Toshinori Numata, Kanagawa-ken (JP); Kiwamu Sakuma, Kanagawa-ken (JP); Haruka Kusai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/738,493

(22) Filed: Jan. 10, 2013

(65) Prior Publication Data

US 2013/0181274 A1    Jul. 18, 2013

(30) Foreign Application Priority Data

Jan. 12, 2012 (JP) ................................ 2012-004082

(51) Int. Cl.
*H01L 29/76* (2006.01)
*H01L 29/792* (2006.01)
(Continued)

(52) U.S. Cl.
CPC ............. *H01L 29/78* (2013.01); *H01L 21/265* (2013.01); *H01L 29/775* (2013.01);
(Continued)

(58) Field of Classification Search
CPC .................. H01L 21/28273; H01L 21/28282; H01L 27/11521; H01L 27/11524; H01L 27/11551; H01L 27/11568; H01L 29/792; H01L 29/42328; H01L 29/42344; H01L 29/66825; H01L 29/66833; H01L 29/7881; H01L 27/11578; H01L 2924/1434; H01L 2924/1435; H01L 2924/1437; H01L 2924/1438; H01L 2924/1443; H01L 27/112; H01L 27/11529; H01L 27/11582; H01L 27/11576; H01L 27/1052; H01L 27/1055; H01L 27/10808; H01L 27/11; H01L 27/11206; H01L 29/1434; H01L 29/1435; H01L 29/1437; H01L 29/1438; H01L 29/1443; H01L 21/265; H01L 21/77; H01L 21/8229; H01L 21/823831; H01L 21/8239

USPC ...................... 257/5, 379, E21.645, E27.081, 257/E45.002, 314, 324, E29.309, E21.209; 438/514, 238, 268

See application file for complete search history.

(56) References Cited

U.S. PATENT DOCUMENTS

2005/0239242 A1    10/2005    Zhu et al.
2006/0076625 A1*    4/2006    Lee et al. ...................... 257/353
(Continued)

FOREIGN PATENT DOCUMENTS

JP    2009/182360    8/2009
WO    WO 2004/019414    3/2004
WO    WO 2010/143306    12/2010

OTHER PUBLICATIONS

Office Action issued in Japanese Patent Application No. 2012-004082, filed Jan. 12, 2012 (with English-language Translation).

*Primary Examiner* — Wensing Kuo
*Assistant Examiner* — Moazzam Hossain
(74) *Attorney, Agent, or Firm* — Oblon, McClelland, Maier & Neustadt, L.L.P.

(57) ABSTRACT

According to one embodiment, a semiconductor device includes a substrate and a first transistor. The substrate has a major surface. The first transistor is provided on the major surface. The first transistor includes a first stacked body, first and second conductive sections, a first gate electrode, and a first gate insulating film. The first stacked body includes first semiconductor layers and first insulating layers alternately stacked. The first semiconductor layers have a side surface. The first conductive section is electrically connected to one of the first semiconductor layers. The second conductive section is apart from the first conductive section and electrically connected to the one of the first semiconductor layers. The first gate electrode is provided between the first and second conductive sections and opposed to the side surface. The first gate insulating film is provided between the first gate electrode and the first semiconductor layers.

13 Claims, 28 Drawing Sheets

(51) Int. Cl.
  *H01L 21/70* (2006.01)
  *H01L 29/78* (2006.01)
  *H01L 21/265* (2006.01)
  *H01L 29/775* (2006.01)
  *H01L 29/788* (2006.01)
  *H01L 27/12* (2006.01)
  *H01L 29/06* (2006.01)
  *H01L 29/10* (2006.01)
  *H01L 27/115* (2006.01)
  *B82Y 10/00* (2011.01)
  *H01L 29/45* (2006.01)

(52) U.S. Cl.
  CPC ......... *H01L 29/785* (2013.01); *H01L 29/7881* (2013.01); *H01L 29/792* (2013.01); *H01L 27/1203* (2013.01); *H01L 27/1211* (2013.01); *H01L 29/0653* (2013.01); *H01L 29/1033* (2013.01); *H01L 27/11534* (2013.01); *H01L 27/11573* (2013.01); *B82Y 10/00* (2013.01); *H01L 29/458* (2013.01); *H01L 29/0673* (2013.01)
  USPC .... 257/314; 257/324; 257/390; 257/E27.098; 257/E29.309; 257/E21.209; 438/514; 438/238

(56) References Cited

U.S. PATENT DOCUMENTS

| | | |
|---|---|---|
| 2008/0090362 A1* | 4/2008 | Kim et al. .................. 438/283 |
| 2009/0057749 A1* | 3/2009 | Gomikawa et al. .......... 257/316 |
| 2009/0309152 A1* | 12/2009 | Knoefler et al. ............. 257/324 |
| 2010/0240205 A1* | 9/2010 | Son et al. .................... 438/588 |
| 2010/0264496 A1* | 10/2010 | Thomas et al. ............... 257/369 |
| 2010/0295022 A1 | 11/2010 | Chang et al. |
| 2011/0062417 A1 | 3/2011 | Iwayama et al. |
| 2011/0169067 A1* | 7/2011 | Ernst et al. .................. 257/316 |

* cited by examiner

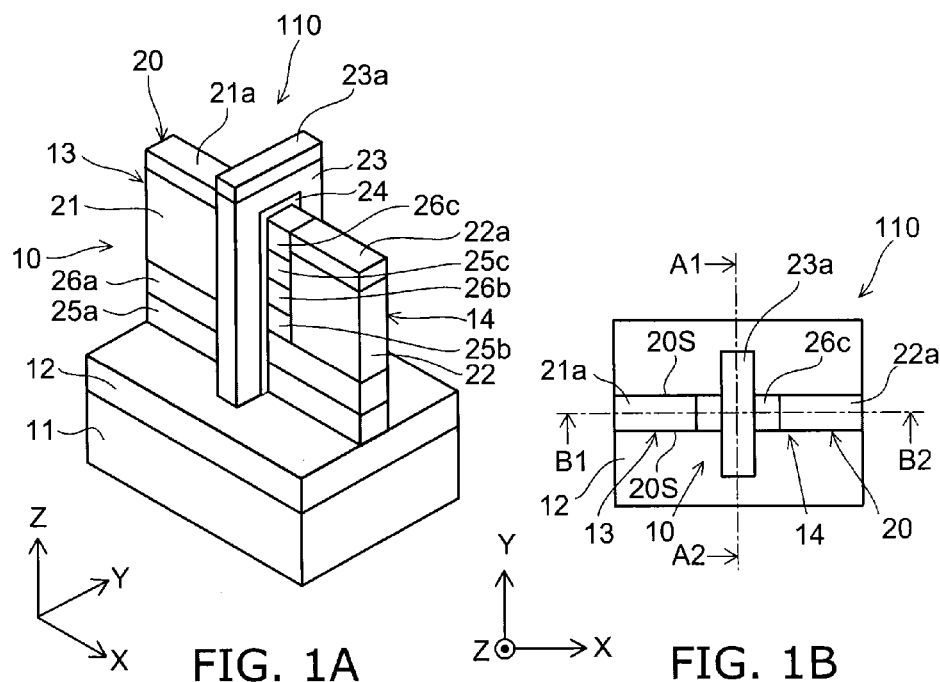
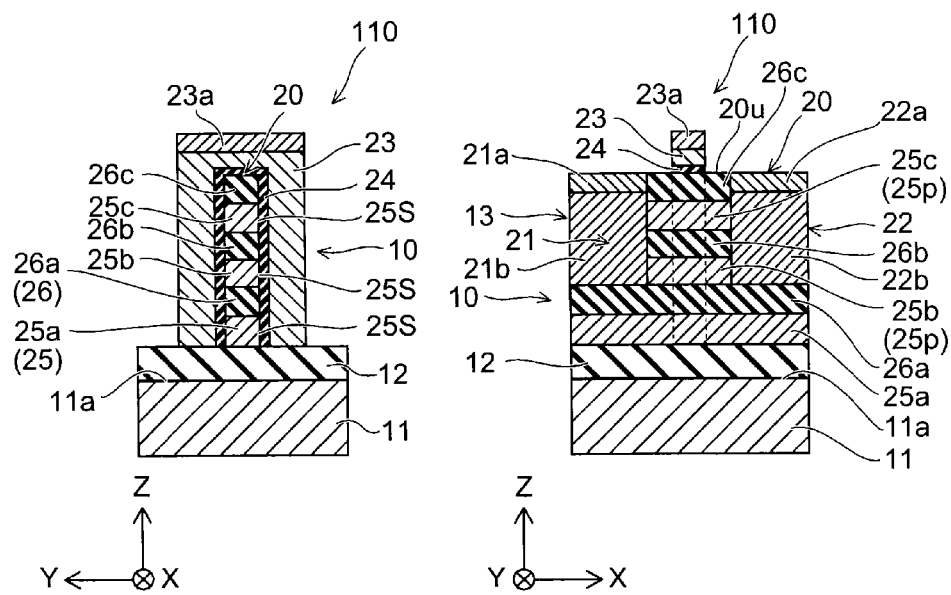

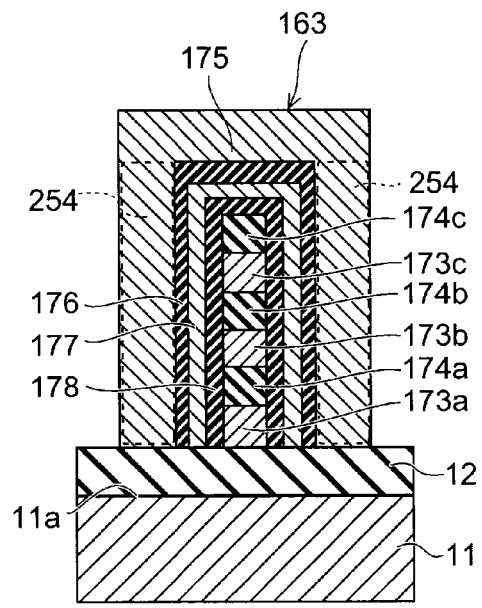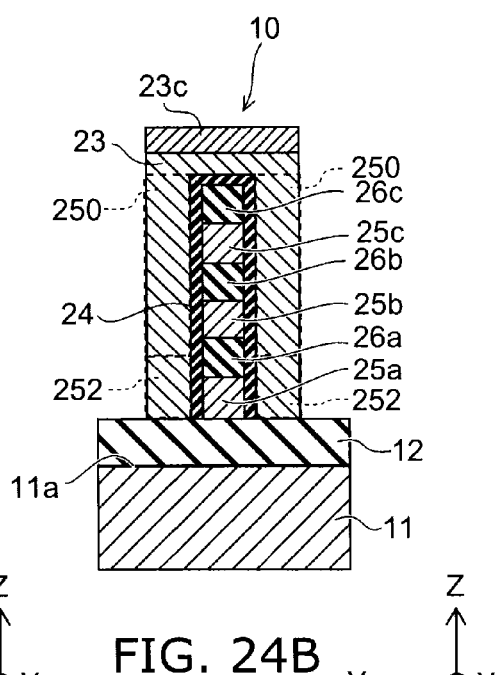
FIG. 24A    FIG. 24B
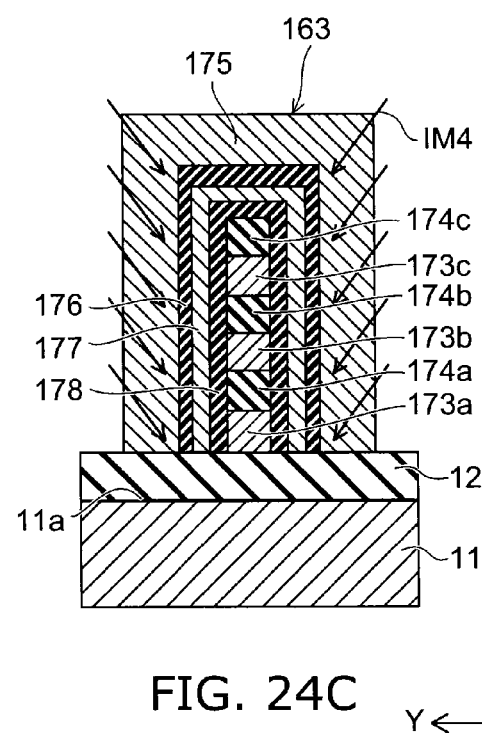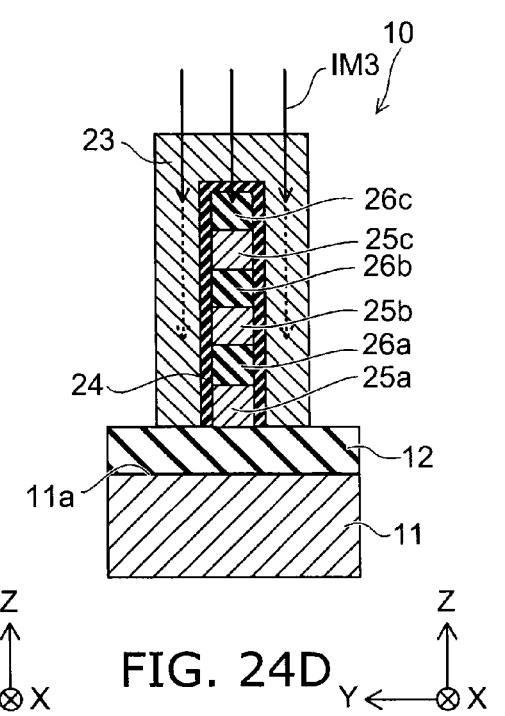
FIG. 24C    FIG. 24D

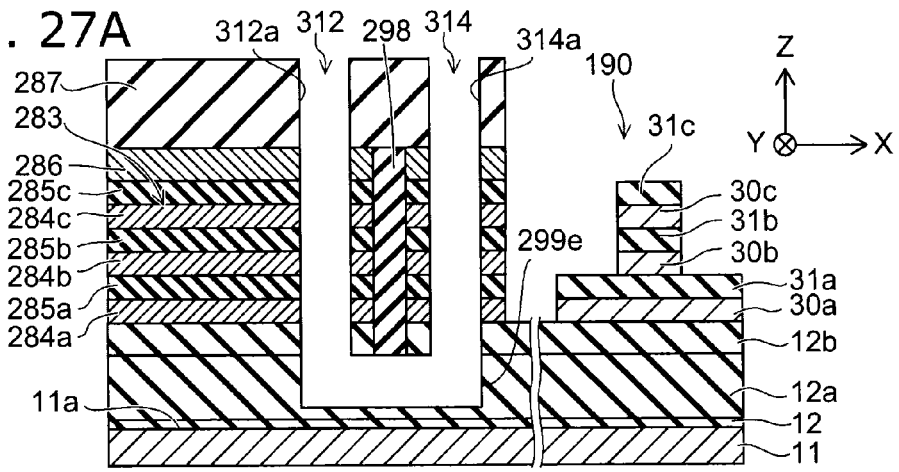
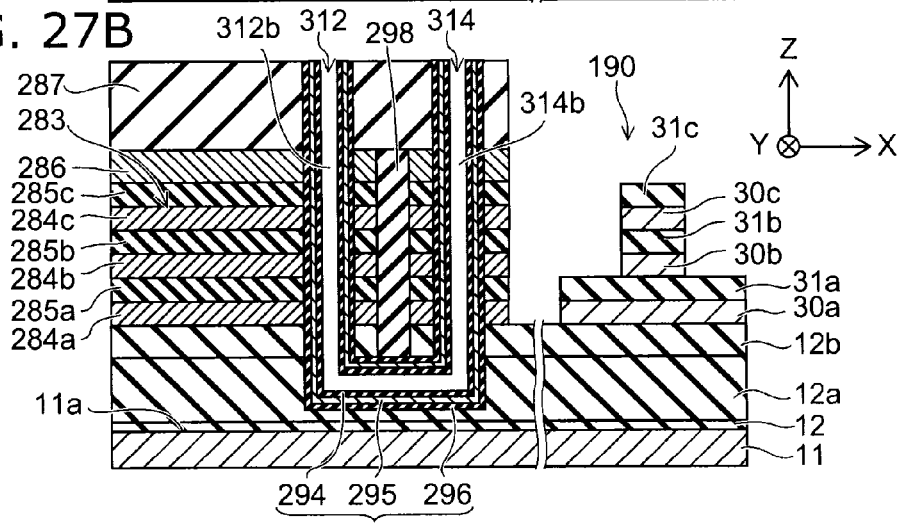
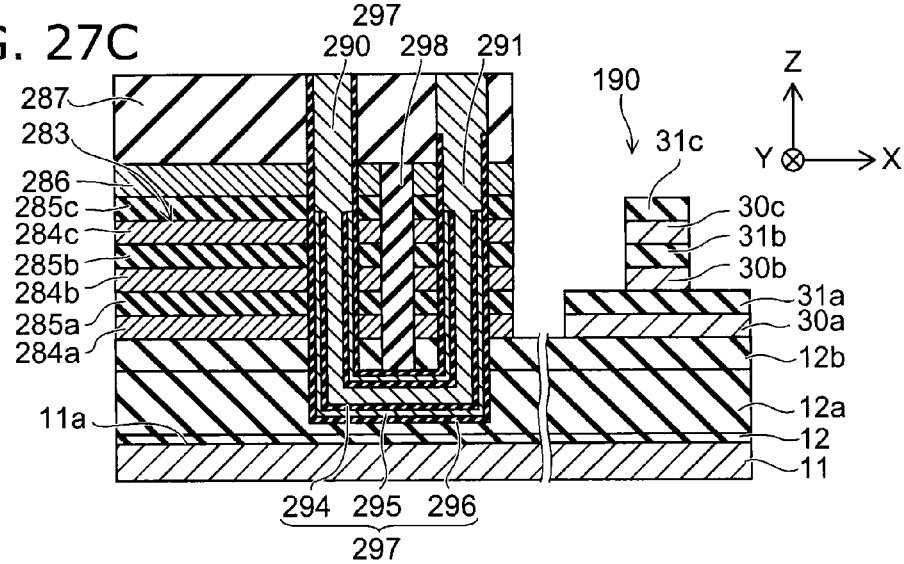

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2012-004082, filed on Jan. 12, 2012; the entire contents of which are incorporated herein by reference.

FIELD

Embodiments described herein relate generally to a semiconductor device and a method for manufacturing the same.

BACKGROUND

Semiconductor devices such as transistors and memories are widely used. For the semiconductor device, it is desired to improve the characteristics without increasing the footprint.

BRIEF DESCRIPTION OF THE DRAWINGS

FIG. 1A to FIG. 1D are schematic views showing a semiconductor device according to a first embodiment;

FIG. 24A to FIG. 24D are schematic cross-sectional views showing another semiconductor device according to the fifth embodiment;

FIG. 27A to FIG. 27C are schematic cross-sectional views showing the method for manufacturing the semiconductor device according to the sixth embodiment.

DETAILED DESCRIPTION

Figure 2A:
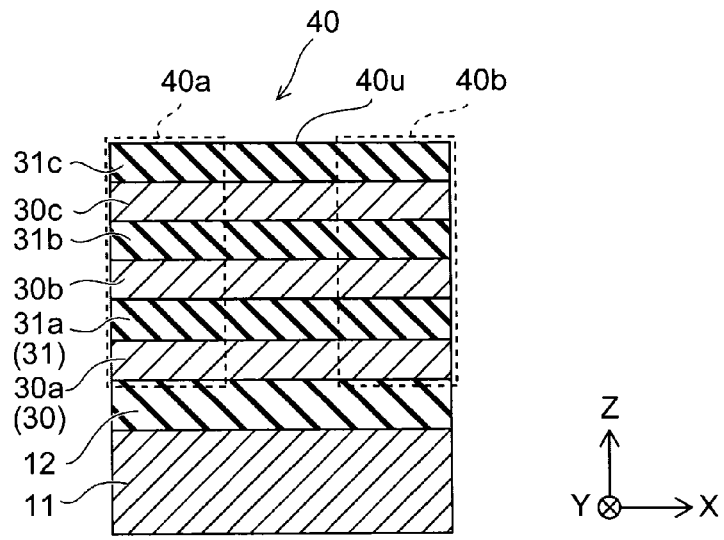
FIG. 2A to FIG. 2C are schematic views showing a method for manufacturing the semiconductor device according to the first embodiment.

According to one embodiment, a semiconductor device includes a substrate and a first transistor. The substrate has a major surface. The first transistor is provided on the major surface. The first transistor includes a first stacked body, a first conductive section, a second conductive section, a first gate electrode, and a first gate insulating film. The first stacked body includes a plurality of first semiconductor layers and a plurality of first insulating layers alternately stacked along a first direction perpendicular to the major surface. Each of the first semiconductor layers has a side surface along the first direction. The first conductive section is electrically connected to at least one of the first semiconductor layers. The second conductive section is apart from the first conductive section in a second direction perpendicular to the first direction and electrically connected to the at least one of the first semiconductor layers. The first gate electrode is provided between the first conductive section and the second conductive section in the second direction and opposed to the side surface of each of the first semiconductor layers. The first gate insulating film is provided between the first gate electrode and the first semiconductor layers.

According to another embodiment, a method is disclosed for manufacturing a semiconductor device. The method can include alternately stacking a plurality of semiconductor films and a plurality of insulating films on a major surface of a substrate along a first direction perpendicular to the major surface to form a stacked matrix having a first region, a second region apart from the first region in a second direction perpendicular to the first direction, and an upper surface intersecting the first direction. The method can include removing a part of the stacked matrix from the upper surface of the stacked matrix in the first region to form a first removal portion. A first side surface of at least one of the semiconductor films is exposed to the first removal portion. The method can include removing a part of the stacked matrix from the upper surface of the stacked matrix in the second region to form a second removal portion. A second side surface of at least one of the semiconductor films is exposed to the second removal portion. The method can include burying a conductive material in the first removal portion to form a first conductive section electrically connected to the first side surface and burying the conductive material in the second removal portion to form a second conductive section electrically connected to the second side surface. The method can include removing a part of the stacked matrix to form a first stacked body including a portion connecting the first region and the second region. A third side surface along the first direction and the second direction and a fourth side surface on an opposite side to the third side surface of the semiconductor films are exposed on the first stacked body. The method can include forming a first gate insulating film on the third side surface and on the fourth side surface. In addition, the method can include forming a first gate electrode on the first gate insulating film between the first region and the second region to form a first transistor on the major surface.

First Embodiment

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

FIG. 1A to FIG. 1D are schematic views illustrating a semiconductor device according to a first embodiment.

FIG. 1A is a schematic perspective view, FIG. 1B is a schematic top view, and FIG. 1C and FIG. 1D are schematic cross-sectional views. FIG. 1C is a cross-sectional view taken along line A1-A2 of FIG. 1B. FIG. 1D is a cross-sectional view taken along line B1-B2 of FIG. 1B.

As shown in FIG. 1A to FIG. 1D, a semiconductor device 110 includes a first transistor 10 and a substrate 11. The substrate 11 has a substantially rectangular plate shape, for example. The substrate 11 has a major surface 11a. The first transistor 10 is provided on the major surface 11a. Silicon, for example, is used for the substrate 11. An interlayer insulating film 12, for example, is provided between the first transistor 10 and the substrate 11. The interlayer insulating film 12 is formed on the entire major surface 11a, for example. The interlayer insulating film 12 electrically insulates the first transistor 10 and the substrate 11. A silicon oxide film, for example, is used as the interlayer insulating film 12.

The first transistor 10 includes a first stacked body 20, a first conductive section 21, a second conductive section 22, a first gate electrode 23, and a first gate insulating film 24.

The first stacked body 20 includes a plurality of first semiconductor layers 25 (e.g. first semiconductor layers 25a to 25c) and a plurality of first insulating layers 26 (first insulating layers 26a to 26c) alternately stacked along the Z-axis direction. The first semiconductor layers 25a to 25c are collectively referred to as a first semiconductor layer 25. The first insulating layers 26a to 26c are collectively referred to as a first insulating layer 26. The number of first semiconductor layers 25 is arbitrary. The number of first insulating layers 26 is arbitrary. Each of the first semiconductor layers 25 has a side surface 25s along the Z-axis direction.

Polysilicon, for example, is used for the first semiconductor layer 25. A silicon oxide film, for example, is used as the first insulating layer 26. When single-crystal silicon is used as the first semiconductor layer 25, for example, the variation in the resistance etc. can be reduced.

For convenience of description, a first direction perpendicular to the major surface 11a is defined as the Z-axis direction. The Z-axis direction is the stacking direction of the first semiconductor layer 25 and the first insulating layer 26. One direction perpendicular to the Z-axis direction is defined as the X-axis direction. The direction perpendicular to the Z-axis direction and the X-axis direction is defined as the Y-axis direction.

In the first semiconductor layers 25 and the first insulating layers 26, the first semiconductor layer 25a, the first insulating layer 26a, the first semiconductor layer 25b, the first insulating layer 26b, the first semiconductor layer 25c, and the first insulating layer 26c are stacked in this order. The first semiconductor layer 25 and the first insulating layer 26 are alternately stacked along the Z-axis direction perpendicular to the major surface 11a. In the specification of this application, "stack" includes not only the case of being stacked in contact with one another but also the case of being stacked via other components.

The thickness (the length along the Z-axis direction) of each of one first semiconductor layer 25 and one first insulating layer 26 is, for example, not less than 3 nm and not more than 50 nm. The width (e.g. the length along the Y-axis direction) of the first semiconductor layer 25 and the width (e.g. the length along the Y-axis direction) of the first insulating layer 26 are, for example, not less than 3 nm and not more than 50 nm. However, the width of the first semiconductor layer 25 and the width of the first insulating layer 26 are arbitrary. For example, the width of the first semiconductor layer 25 and the width of the first insulating layer 26 may be wider than 50 nm. Thereby, a large current can be passed through the first transistor 10.

The first conductive section 21 is electrically connected to a first semiconductor layer 25p of at least one of first semiconductor layers 25. In this example, the first conductive section 21 is electrically connected to the first semiconductor layer 25b and the first semiconductor layer 25c. The second conductive section 22 is electrically connected to at least the one of the first semiconductor layers 25p mentioned above (the first semiconductor layers 25 connected to the first conductive section 21). That is, in this example, the second conductive section 22 is electrically connected to the first semiconductor layer 25b and the first semiconductor layer 25c.

The second conductive section 22 is apart from the first conductive section 21 in a second direction perpendicular to the Z-axis direction. In this example, the second direction is the X-axis direction. That is, the second conductive section 22 is apart from the first conductive section 21 in the X-axis direction. However, the second direction is not limited to the X-axis direction but may be an arbitrary direction perpendicular to the Z-axis direction.

The first stacked body 20 has a rectangular parallelepiped shape, for example. Each of the first semiconductor layer 25 and the first insulating layer 26 has, for example, a substantially rectangular plate shape. For example, the first semiconductor layer 25 and the first insulating layer 26 extend in the second direction. In this example, the first stacked body 20 extends along the X-axis direction. The first conductive section 21 is provided at one end in the X-axis direction of the first stacked body 20. The second conductive section 22 is provided at the other end in the X-axis direction of the first stacked body 20. However, the direction in which the first stacked body 20 extends is not limited to the second direction but may be an arbitrary direction perpendicular to the Z-axis direction.

The first conductive section 21 and the first semiconductor layers 25p connected to the first conductive section 21 (in this example, the first semiconductor layers 25b and 25c) constitute a source section 13 of the first transistor 10. The second conductive section 22 and the first semiconductor layers 25p connected to the second conductive section 22 (the first semiconductor layers 25b and 25c) constitute a drain section 14 of the first transistor 10.

Also a configuration in which the drain section 14 is on the first conductive section 21 side and the source section 13 is on the second conductive section 22 side is possible. In the following, a description is given on the assumption that the source section 13 is on the first conductive section 21 side and the drain section 14 is on the second conductive section 22 side.

The first conductive section 21 and the second conductive section 22 extend downward from the uppermost layer of the first semiconductor layers 25, for example. The uppermost layer of the first conductive section 21 and the uppermost layer of the second conductive section 22 are exposed upward, for example. The "uppermost layer" of the first semiconductor layers 25 is the first semiconductor layer located most distant from the substrate 11 out of the first semiconductor layers 25. In this example, the first semiconductor layer 25c corresponds to the uppermost layer. "Upward" is the direction from the substrate 11 toward the first semiconductor layer 25c of the uppermost layer (a direction along the Z-axis direction).

Polysilicon, for example, is used for the first conductive section 21 and the second conductive section 22.

The first conductive section 21 may include, for example, a first silicide portion 21a and a first silicon portion 21b. The first silicide portion 21a is provided on the upper side of the first conductive section 21. The first silicon portion 21b is provided between the first silicide portion 21a and the substrate 11. The first silicide portion 21a serves as a connection terminal when the first conductive section 21 and an interconnection (not shown) are connected.

The second conductive section 22 may include, for example, a second silicide portion 22a and a second silicon portion 22b. The second silicide portion 22a is provided on the upper side of the second conductive section 22. The second silicon portion 22b is provided between the second silicide portion 22a and the substrate 11. The second silicide portion 22a serves as a connection terminal when the second conductive section 22 and an interconnection (not shown) are connected.

For the first silicide portion 21a and the second silicide portion 22a, for example, nickel silicide, platinum silicide, nickel platinum silicide, cobalt silicide, titanium silicide, palladium silicide, tungsten silicide, erbium silicide, or the like is used. For the first silicon portion 21b and the second silicon portion 22b, for example, polysilicon is used.

In the second direction, the first gate electrode 23 is disposed between the source section 13 and the drain section 14 of the first transistor 10. In this example, the first gate electrode 23 is disposed in a central region in the X-axis direction of the first stacked body 20. The first gate electrode 23 is opposed to two side surfaces 20s in the Y-axis direction (surfaces parallel to the first direction and the second direction) of the first stacked body 20 and the upper surface 20u of the first stacked body 20. The first gate electrode 23 is opposed to the side surface 25s (a surface parallel to the first direction and the second direction) of each of the first semiconductor layers 25.

In the specification of this application, "oppose" includes not only the state of facing directly but also the state of facing via another component.

As the first gate electrode 23, for example, a polysilicon single film, a metal semiconductor compound single film, a metal film, a stacked film, or the like may be used. As the metal semiconductor compound single film, for example, metal silicide or the like may be used. As the metal film, for example, TiN, W, TaC, or the like may be used. As the stacked film, for example, a stacked film of a metal semiconductor compound film and a semiconductor such as a polysilicon film, a stacked film of a metal film and a semiconductor such as a polysilicon film, or the like is used.

The first gate electrode 23 may include a silicide portion 23a serving as a connection terminal when an interconnection is connected. The silicide portion 23a is provided in an upper portion of the first gate electrode 23. For the silicide portion 23a, for example, a similar material to the first silicide portion 21a of the first conductive section 21 is used.

The first gate insulating film 24 is provided between the first gate electrode 23 and the first stacked body 20. The first gate insulating film 24 is in contact with the first gate electrode 23 and the first stacked body 20, for example. The first gate insulating film 24 electrically isolates between the first gate electrode 23 and the first stacked body 20. The first gate insulating film 24 is provided between the first gate electrode and the first semiconductor layer 25. The first gate insulating film 24 is in contact with the first semiconductor layer 25.

As the first gate insulating film 24, for example, a silicon oxide film, a silicon oxynitride film, a high dielectric film (a high-k film), a stacked film, or the like may be used. As the high dielectric film, for example, a hafnium oxide film, a zirconium oxide film, or the like may be used. As the stacked film, for example, a stacked film of a silicon oxide film and a high dielectric film or the like may be used.

In the first transistor 10, by applying a voltage to the first gate electrode 23, a channel is formed in a portion opposed to the first gate electrode 23 of the first semiconductor layer 25. The first transistor 10 is, for example, a stacked nanowire channel transistor. The first semiconductor layers 25b and 25c are electrically connected to each other by the first conductive section 21 and the second conductive section 22. On the other hand, the first semiconductor layer 25a of the first layer is insulated from the first semiconductor layers 25b and 25c with the first insulating layer 26a. In the first transistor 10, the first semiconductor layers 25b and 25c function as a channel, and the first semiconductor layer 25a does not function as a channel.

In the semiconductor device 110, by altering the number of first semiconductor layers 25 electrically connected to the first conductive section 21 and the second conductive section 22, the characteristics of the first transistor 10 can be controlled without increasing the footprint of the first transistor 10. For example, the current of the first transistor 10 can be controlled with good accuracy in a wide range. Furthermore, the number of transistor channels can be increased without increasing the footprint. Furthermore, costs can be reduced.

In the semiconductor device 110 according to the embodiment, the first semiconductor layer 25a not functioning as a channel is electrically insulated from the first semiconductor layers 25b and 25c functioning as a channel. A leak current flowing through the first semiconductor layer 25a not functioning as a channel can be suppressed, and power consumption can be reduced. Since the layout of the first transistor 10 as viewed from the upper surface is the same as that of a single-layer channel transistor, conventional circuit layouts can be used as they are. In the semiconductor device 110, also an increase in cost resulting from the design of the layout can be avoided.

A method for manufacturing the semiconductor device 110 according to the embodiment will now be described.

FIG. 2A to FIG. 2C, FIG. 3A and FIG. 3B, FIG. 4A and FIG. 4B, and FIG. 5A to FIG. 5C are schematic views illustrating a method for manufacturing the semiconductor device according to the first embodiment.

Figure 2B:
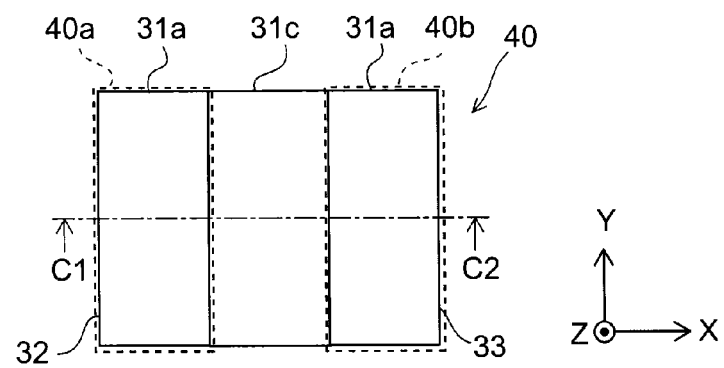
Figure 2C:
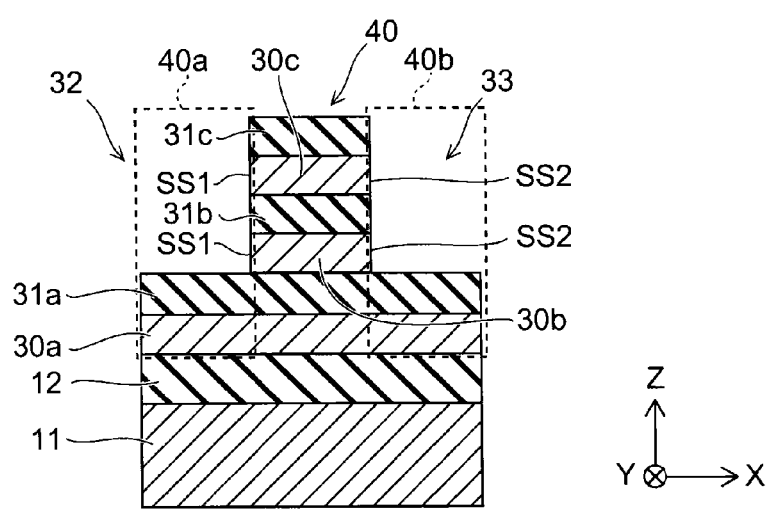
Figure 3A:
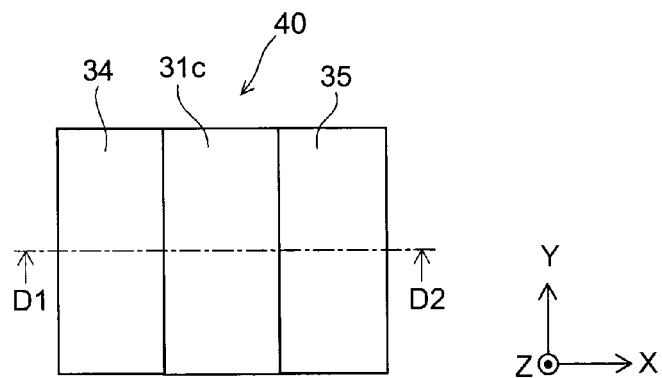
FIG. 3A and FIG. 3B are schematic views showing the method for manufacturing the semiconductor device according to the first embodiment.
Figure 3B:
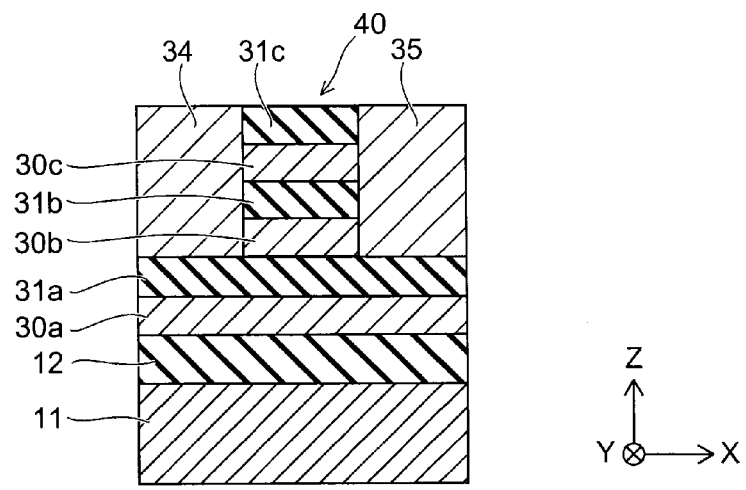
Figure 4A:
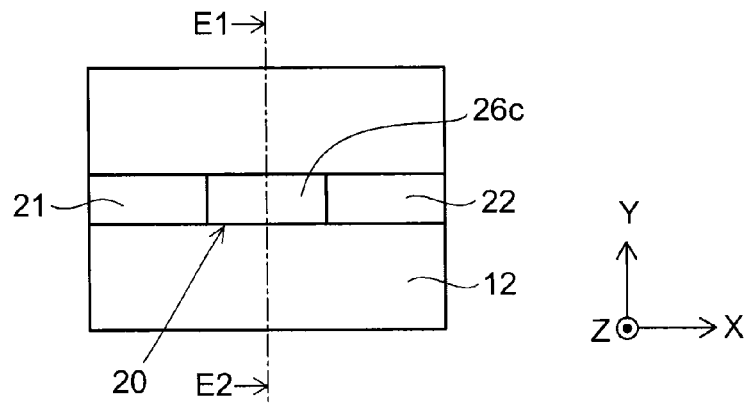
FIG. 4A and FIG. 4B are schematic views showing the method for manufacturing the semiconductor device according to the first embodiment.
Figure 4B:
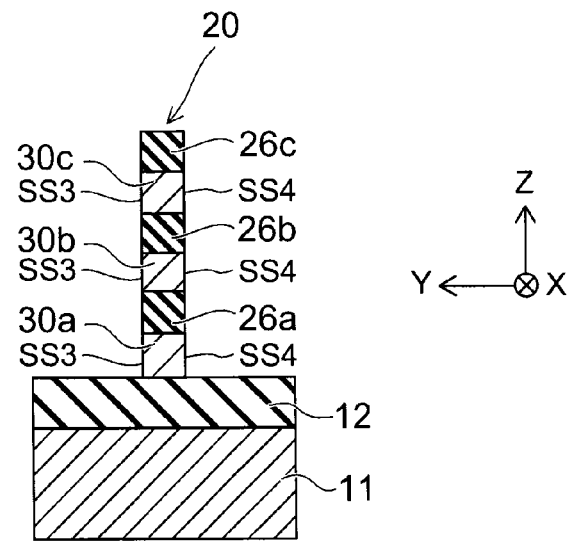
Figure 5A:
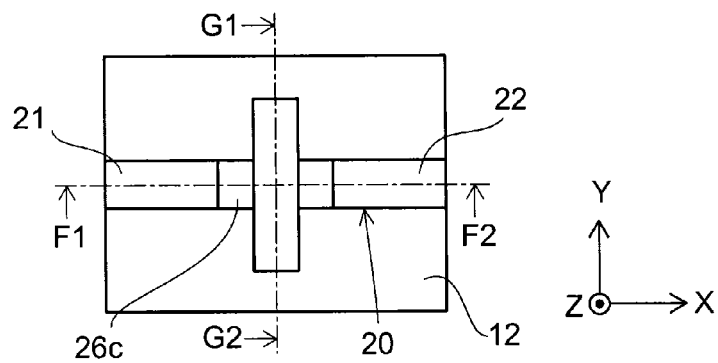
FIG. 5A to FIG. 5C are schematic views showing the method for manufacturing the semiconductor device according to the first embodiment.
Figure 5B:
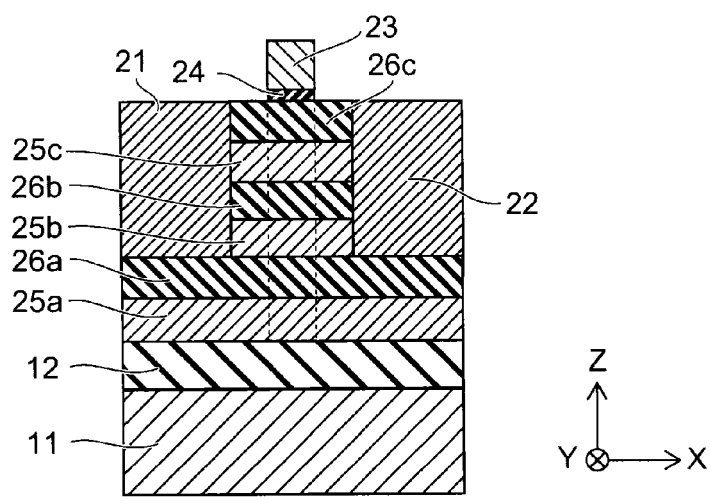
Figure 5C:
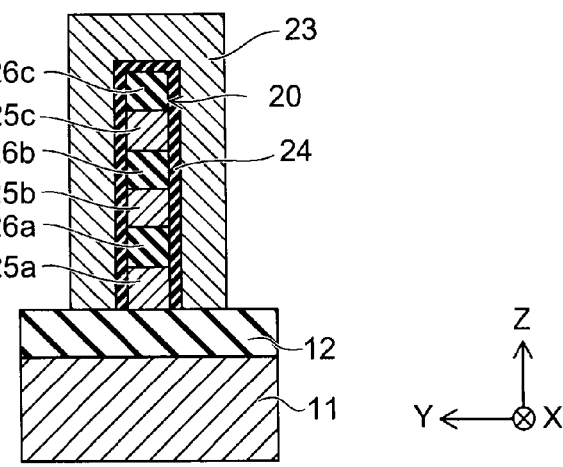

FIG. 2A is a schematic cross-sectional view, FIG. 2B is a schematic top view, and FIG. 2C is a schematic cross-sectional view (a cross-sectional view taken along line C1-C2 of FIG. 2B). FIG. 3A is a schematic top view, and FIG. 3B is a schematic cross-sectional view (a cross-sectional view taken along line D1-D2 of FIG. 3A). FIG. 4A is a schematic top view, and FIG. 4B is a schematic cross-sectional view (a cross-sectional view taken along line E1-E2 of FIG. 4A). FIG. 5A is a schematic top view, FIG. 5B is a schematic cross-sectional view, and FIG. 5C is a schematic cross-sectional view. FIG. 5B schematically shows a cross section taken along line F1-F2 of FIG. 5A. FIG. 5C schematically shows a cross section taken along line G1-G2 of FIG. 5A.

As shown in FIG. 2A, in the manufacturing of the semiconductor device 110, first, the interlayer insulating film 12 is formed on the major surface 11a of the substrate 11. Further, on the interlayer insulating film 12, a semiconductor film 30a, an insulating film 31a, a semiconductor film 30b, an insulating film 31b, a semiconductor film 30c, and an insulating film 31c are stacked in this order to form a stacked matrix 40. The stacked matrix 40 includes a first region 40a and a second region 40b apart from the first region 40a in the second direction (in this example, the X-axis direction). The stacked matrix 40 has an upper surface 40u intersecting the Z-axis direction.

Thus, the semiconductor films 30a to 30c and the insulating films 31a to 31c are alternately stacked along the Z-axis direction on the major surface 11a of the substrate 11. Hereinafter, the semiconductor films 30a to 30c are collectively referred to as a semiconductor film 30. The insulating films 31a to 31c are collectively referred to as an insulating film 31. The semiconductor film 30 forms the first semiconductor layer 25. The insulating film 31 forms the first insulating layer 26. An amorphous silicon film, for example, is used as the semiconductor film 30. A silicon oxide film, for example, is used as the insulating film 31.

As shown in FIG. 2B and FIG. 2C, a first removal portion 32 and a second removal portion 33 are formed in the stacked matrix 40. The first removal portion 32 is formed by removing a part of the stacked matrix 40 from the upper surface 40u of the stacked matrix 40 in the first region 40a. A first side surface SS1 of at least one of the semiconductor films 30 is exposed to the first removal portion 32. In this example, the first removal portion 32 is formed by removing a part of the semiconductor film 30b, a part of the insulating film 31b, a part of the semiconductor film, and a part of the insulating film 31c. The first side surface SS1 of the semiconductor film 30b and the first side surface SS1 of the semiconductor film 30c are exposed to the first removal portion 32.

The second removal portion 33 is formed by removing a part of the stacked matrix 40 from the upper surface 40u of the stacked matrix 40 in the second region 40b. A second side surface SS2 of at least one of the semiconductor films 30 is exposed to the second removal portion 33. In this example, the second removal portion 33 is formed by removing a part of the semiconductor film 30b, a part of the insulating film 31b, a part of the semiconductor film 30c, and a part of the insulating film 31c. The second side surface SS2 of the semiconductor film 30b and the second side surface SS2 of the semiconductor film 30c are exposed to the first removal portion 33. The first removal portion 32 and the second removal portion 33 are formed by, for example, performing a photolithography process and an etching process on the stacked matrix 40.

As shown in FIG. 3A and FIG. 3B, a conductive material 34 is buried in the first removal portion 32, and a conductive material 35 is buried in the second removal portion 33. Amorphous silicon, for example, is used as the conductive materials 34 and 35. The burying of the conductive materials 34 and 35 is performed by, for example, depositing an amorphous silicon layer over the entire wafer and then planarizing the surface by CMP (chemical mechanical polishing).

As shown in FIG. 4A and FIG. 4B, parts of the stacked matrix 40 are removed. Thereby, the first conductive section 21 electrically connected to the first side surface SS1 and the second conductive section 22 electrically connected to the second side surface SS2 are formed, and the first stacked body 20 is formed. The first stacked body 20 includes a portion connecting the first region 40a and the second region 40b. In the first stacked body 20, a third side surface SS3 along the first direction (the Z-axis direction) and the second direction (in this example, the X-axis direction) and a fourth side surface SS4 on the opposite side to the third side surface SS3 of the semiconductor film 30 are exposed. By forming the first stacked body 20, the first insulating layers 26 of the semiconductor device 110 are formed from the insulating film 31a of the first layer, the insulating film 31b of the second layer, and the insulating film 31c of the third layer. In this example, the formation of the first conductive section 21 and the second conductive section 22 and the formation of the first stacked body 20 are performed simultaneously. The formation of the first conductive section 21 and the second conductive section 22 may be performed separately from the formation of the first stacked body 20.

After the first stacked body 20 is formed, heat treatment is performed to crystallize the semiconductor film 30a, the semiconductor film 30b, and the semiconductor film 30c and the conductive materials of the first conductive section 21 and the second conductive section 22, which include amorphous silicon, into polysilicon. Thereby, the first semiconductor layer 25 is formed from the semiconductor film 30. The first side surface SS1, the second side surface SS2, the third side surface SS3, and the fourth side surface SS4 constitute the side surfaces 25s of the first semiconductor layer 25. The heat treatment may be performed before the process for forming the first stacked body 20.

As shown in FIG. 5A to FIG. 5C, the first gate insulating film 24 is formed on the third side surface SS3 and on the fourth side surface SS4. After that, the first gate electrode 23 is formed on the first gate insulating film 24 between the first region 40a (the first conductive section 21) and the second region 40b (the second conductive section 22). For example, after the first stacked body 20 is formed and heat treatment is performed, a silicon oxide film that forms the first gate insulating film 24 is deposited over the entire wafer. A polysilicon film that forms the first gate electrode 23 is deposited on the silicon oxide film. Then, unnecessary portions of the silicon oxide film and the polysilicon film are etched to form the first gate electrode 23 and the first gate insulating film 24. In this example, the width in the X-axis direction of the first gate insulating film 24 is equal to the width in the X-axis direction of the first gate electrode 23. The width in the X-axis direction of the first gate insulating film 24 may be wider than the width in the X-axis direction of the first gate electrode 23.

After the first gate electrode 23 and the first gate insulating film 24 are formed, the first semiconductor layer 25, the first insulating layer 26, the first conductive section 21, and the second conductive section 22 are doped with an impurity. Thereby, the source section 13 and the drain section 14 are formed. For the doping of an impurity, for example, a method such as beam line ion implantation, gas phase doping, and plasma doping is used. After that, the first silicide portion 21a, the second silicide portion 22a, and the silicide portion 23a are formed in upper portions of the first conductive section 21, the second conductive section 22, and the first gate electrode 23, respectively.

Thus, the semiconductor device 110 according to the embodiment is completed.

Figure 6:
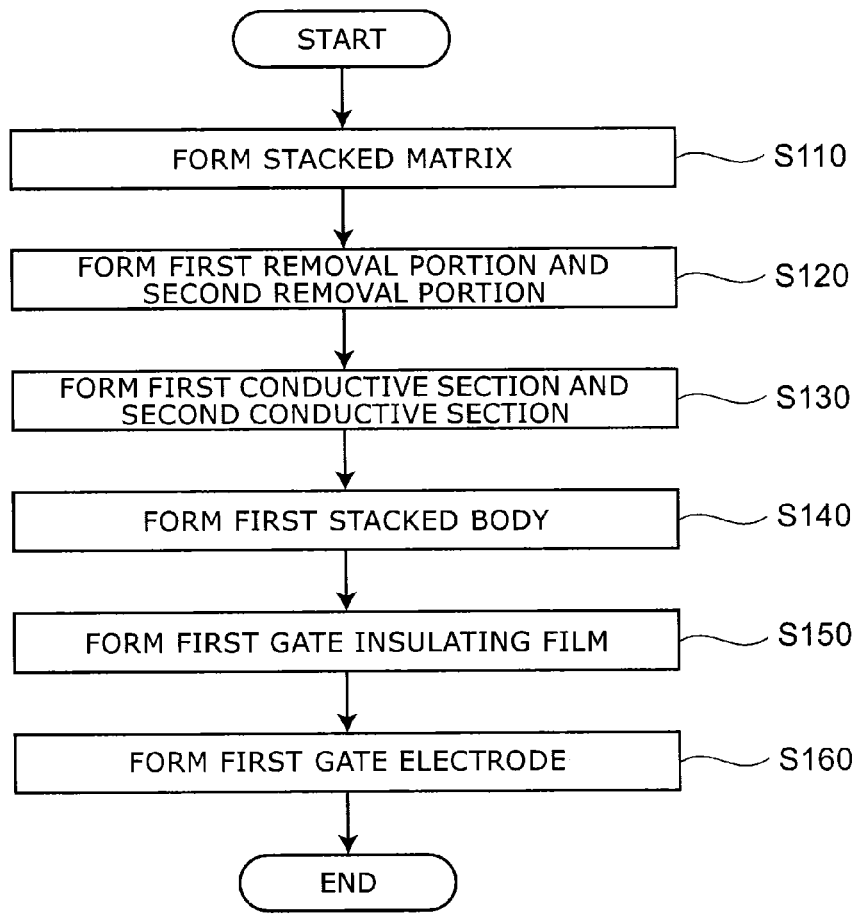
FIG. 6 is a flow chart showing the method for manufacturing the semiconductor device according to the first embodiment.

FIG. 6 is a flow chart illustrating a method for manufacturing the semiconductor device according to the first embodiment.

As shown in FIG. 6, the method for manufacturing the semiconductor device 110 includes step S110 that forms the stacked matrix 40, step S120 that forms the first removal portion 32 and the second removal portion 33, step S130 that forms the first conductive section 21 and the second conductive section 22, step S140 that forms the first stacked body 20, step S150 that forms the first gate insulating film 24, and step S160 that forms the first gate electrode 23. Thereby, the semiconductor device 110 with improved characteristics can be manufactured without increasing the footprint.

In step S110, for example, the process described in regard to FIG. 2A is performed. In step S120, for example, the process described in regard to FIG. 2B and FIG. 2C is performed. In step S130, for example, the process described in regard to FIG. 3A and FIG. 3B is performed. In step S140, for example, the process described in regard to FIG. 4A and FIG. 4B is performed. In step S150 and step S160, for example, the process described in regard to FIG. 5A to FIG. 5C is performed.

The order of steps S110 to S150 mentioned above may be changed within the extent of technical feasibility, and may be performed simultaneously. For example, step S140 may be performed between step S110 and step S120. That is, the first removal portion 32 and the second removal portion 33 may be formed after the first stacked body 20 is formed.

Figure 7:
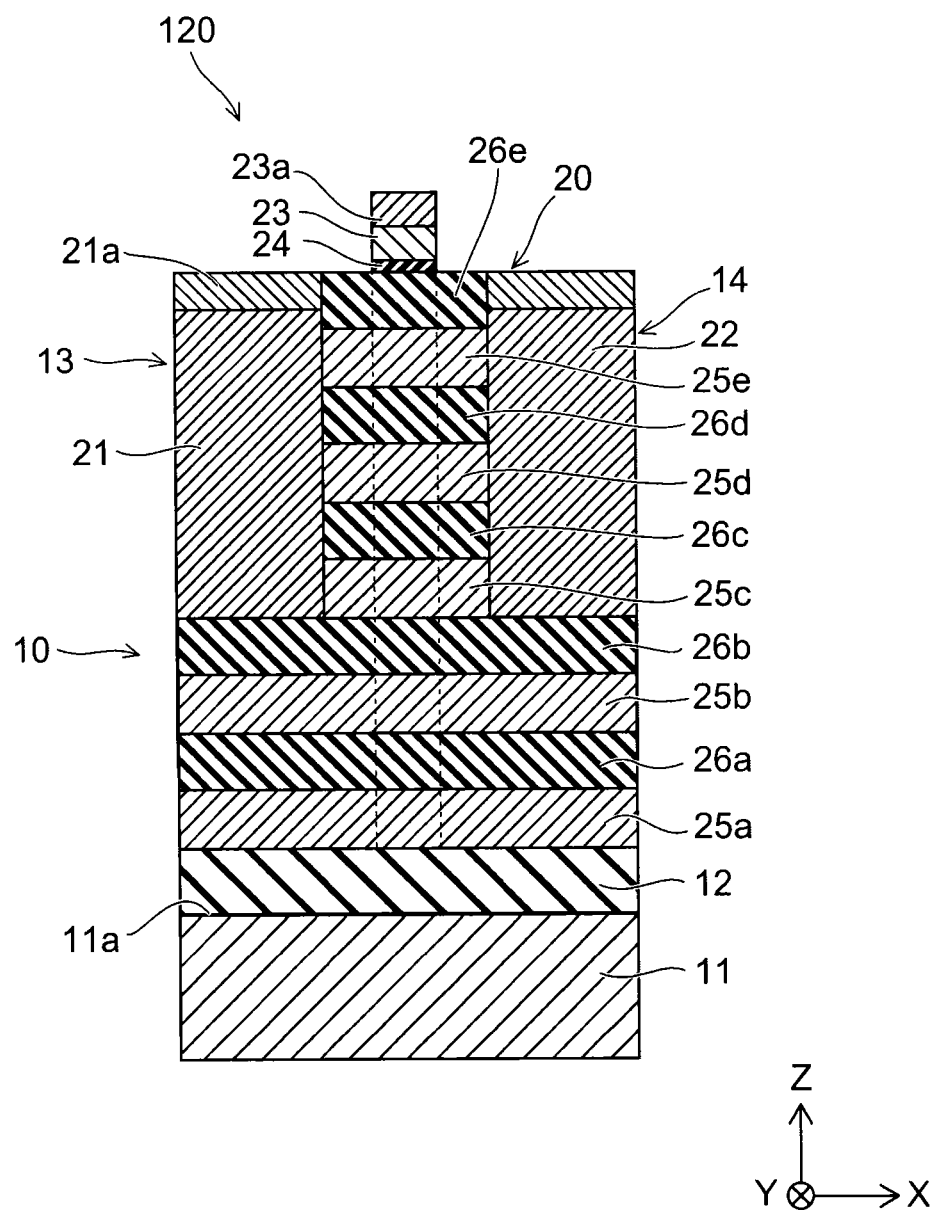
FIG. 7 is a schematic cross-sectional view showing another semiconductor device according to the first embodiment.

FIG. 7 is a schematic cross-sectional view illustrating another semiconductor device according to the first embodiment.

FIG. 7 is a cross-sectional view corresponding to a cross section taken along line B1-B2 of FIG. 1B.

As shown in FIG. 7, in another semiconductor device 120 according to the embodiment, the first semiconductor layers 25 and the first insulating layers 26 further include the first semiconductor layer 25d, the first insulating layer 26d, the first semiconductor layer 25e, and the first insulating layer 26e stacked in this order. The first stacked body 20 of the first transistor 10 includes first semiconductor layers 25a to 25e and first insulating layers 26a to 26e. The first stacked body 20 has a five-layer structure. In this example, in the first transistor 10, three layers of the first semiconductor layers 25c to 25e and the first conductive section 21 are electrically connected, and the first semiconductor layers 25c to 25e and the second conductive section 22 are electrically connected.

For the numbers of first semiconductor layers 25 and first insulating layers 26 stacked, arbitrary n layers (n being a natural number of 2 or more) are possible. For the number of first semiconductor layers 25 to which the first conductive section 21 and the second conductive section 22 are electrically connected, m layers (m being a natural number of not less than 1 and less than n) are possible.

The number of first semiconductor layers 25 which are electrically connected to the first conductive section 21 may not be the same as the number of first semiconductor layers 25 which are electrically connected to the second conductive section 22. At least one of the first semiconductor layers 25 which are electrically connected to the first conductive section 21 is electrically connected to the second conductive section 22. The number of first semiconductor layers 25 which are electrically connected to the second conductive section 22 may be larger than the number of first semiconductor layers 25 which are electrically connected to the first conductive section 21. For example, in the semiconductor device 110, when the first conductive section 21 is connected to the first semiconductor layers 25b and 25c, the second conductive section 22 may be electrically connected to the first semiconductor layers 25a, 25b, and 25c.

Figure 8:
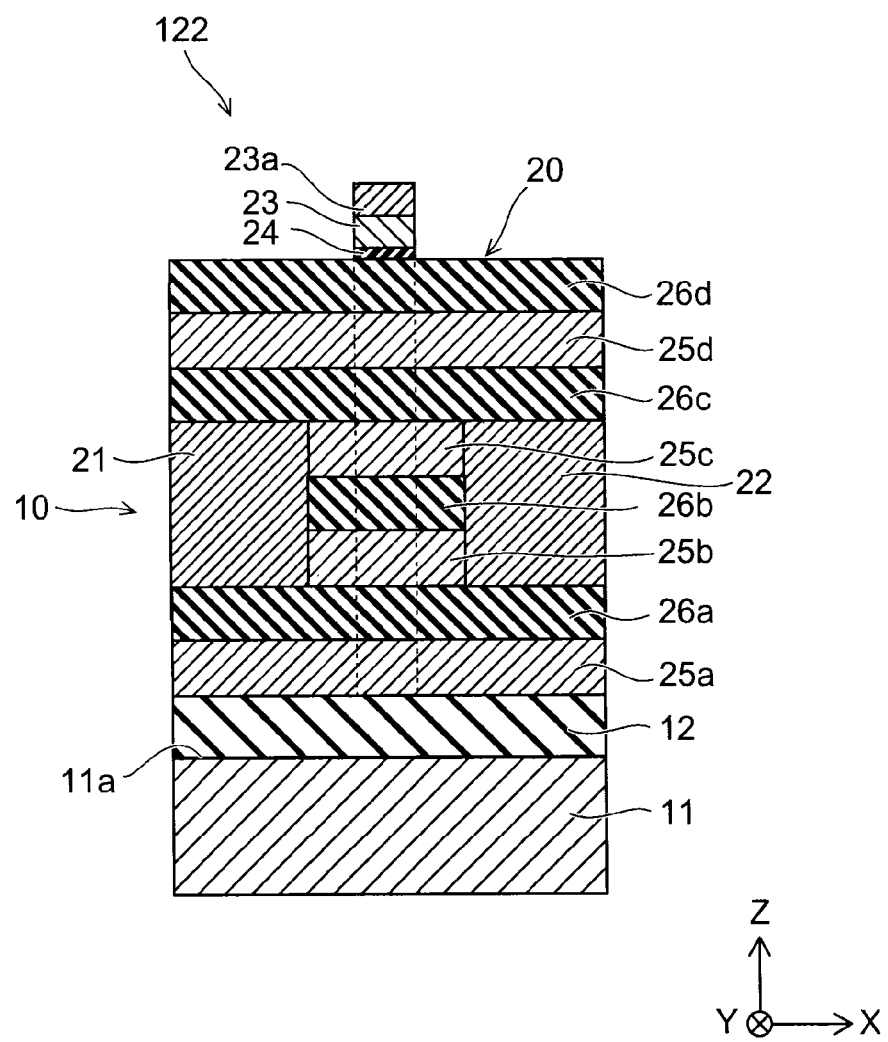
FIG. 8 is a schematic cross-sectional view showing another semiconductor device according to the first embodiment.

FIG. 8 is a schematic cross-sectional view illustrating another semiconductor device according to the first embodiment.

FIG. 8 is a cross-sectional view corresponding to a cross section taken along line B1-B2 of FIG. 1B.

As shown in FIG. 8, in another semiconductor device 122 according to the embodiment, the first stacked body 20 of the first transistor 10 includes first semiconductor layers 25a to 25d and first insulating layers 26a to 26d. The first stacked body 20 has a four-layer structure. In the first transistor 10, the first semiconductor layer 25b and the first semiconductor layer 25c are electrically connected to the first conductive section 21 and the second conductive section 22. The first semiconductor layer 25a of the first layer and the first semiconductor layer 25b are electrically insulated by the first insulating layer 26a of the first layer. The first semiconductor layer 25c and the first semiconductor layer 25d are electrically insulated by the first insulating layer 26c.

In the semiconductor device 110, the first semiconductor layer 25c and the first semiconductor layer 25b of the second layer are connected through the first conductive section 21 and the second conductive section 22. As shown in the semiconductor device 122, the first semiconductor layers 25 electrically connected to the first conductive section 21 and the second conductive section 22 may not include the first semiconductor layer 25 of the uppermost layer. The first semiconductor layer 25 which is electrically connected to the first conductive section 21 and the second conductive section 22 may be the first semiconductor layer 25 at an arbitrary position out of the first semiconductor layers 25 of n layers.

The manufacturing of the semiconductor device is made easier by a configuration in which, for example, the first conductive section 21 and the second conductive section 22 are electrically connected to the first semiconductor layer 25 of the uppermost layer. When a part of the first conductive section 21 and a part of the second conductive section 22 are exposed upward, the connection of an interconnection to the first conductive section 21 and the second conductive section 22 is easy.

In the semiconductor device 110, the side surface portions of the first conductive section 21 and the second conductive section 22 are exposed in the X-axis direction and the Y-axis direction. In the embodiment, the shape of the first conductive section 21 and the second conductive section 22 is not limited thereto. The first conductive section 21 and the second conductive section 22 may be in a columnar shape provided in the first stacked body 20. The first conductive section 21 and the second conductive section 22 may have, for example, a shape of a contact plug.

Figure 9:
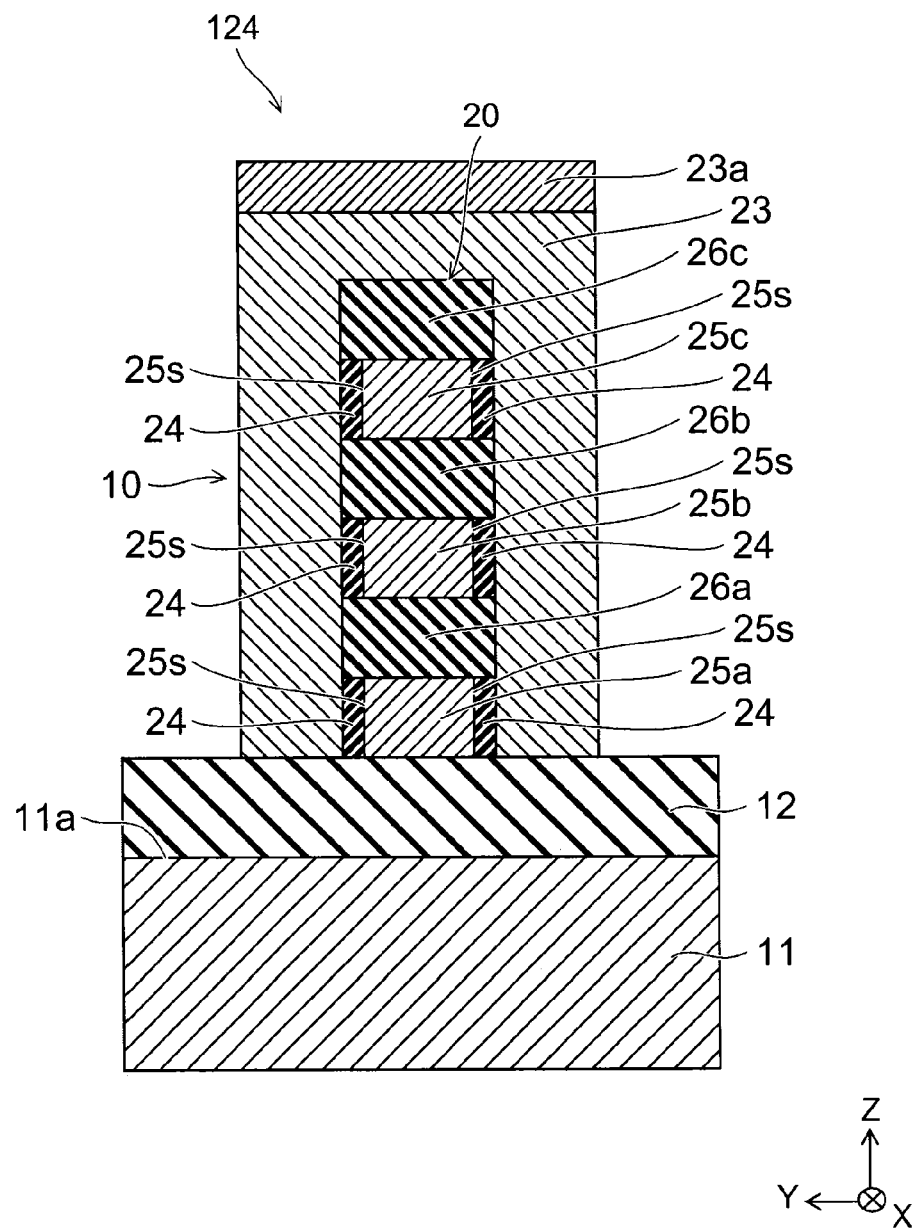
FIG. 9 is a schematic cross-sectional view showing another semiconductor device according to the first embodiment.

FIG. 9 is a schematic cross-sectional view illustrating another semiconductor device according to the first embodiment.

FIG. 9 is a cross-sectional view corresponding to a cross section taken along line A1-A2 of FIG. 1B.

In the semiconductor device 110, the first gate insulating film 24 of the first transistor 10 is provided between the first gate electrode 23 and the first stacked body 20, and is opposed to two side surfaces 20s in the Y-axis direction of the first stacked body 20 and the upper surface 20u of the first stacked body 20.

In contrast, as shown in FIG. 9, in another semiconductor device 124 according to the embodiment, the first gate insulating film 24 of the first transistor 10 is provided on the side surface 25s of each of the first semiconductor layers 25.

Thus, the first gate insulating film 24 is not limited to between the first gate electrode 23 and the first stacked body 20, and needs only to be provided at least between the first gate electrode 23 and the first semiconductor layer 25. The first gate insulating film 24 is, for example, provided in a plurality to correspond to the side surface 25s of each of the first semiconductor layers 25. When the first gate insulating film 24 like this is formed, for example, a part of the stacked matrix 40 is removed to form the first stacked body 20 (the state shown in FIG. 4B), and then a thermal oxidation process is performed on the stacked matrix 40. Thereby, the portion of the side surface 25s of the first semiconductor layer 25 including polysilicon is oxidized, and the first gate insulating film 24 including a silicon oxide film is formed.

Second Embodiment

Figure 10:
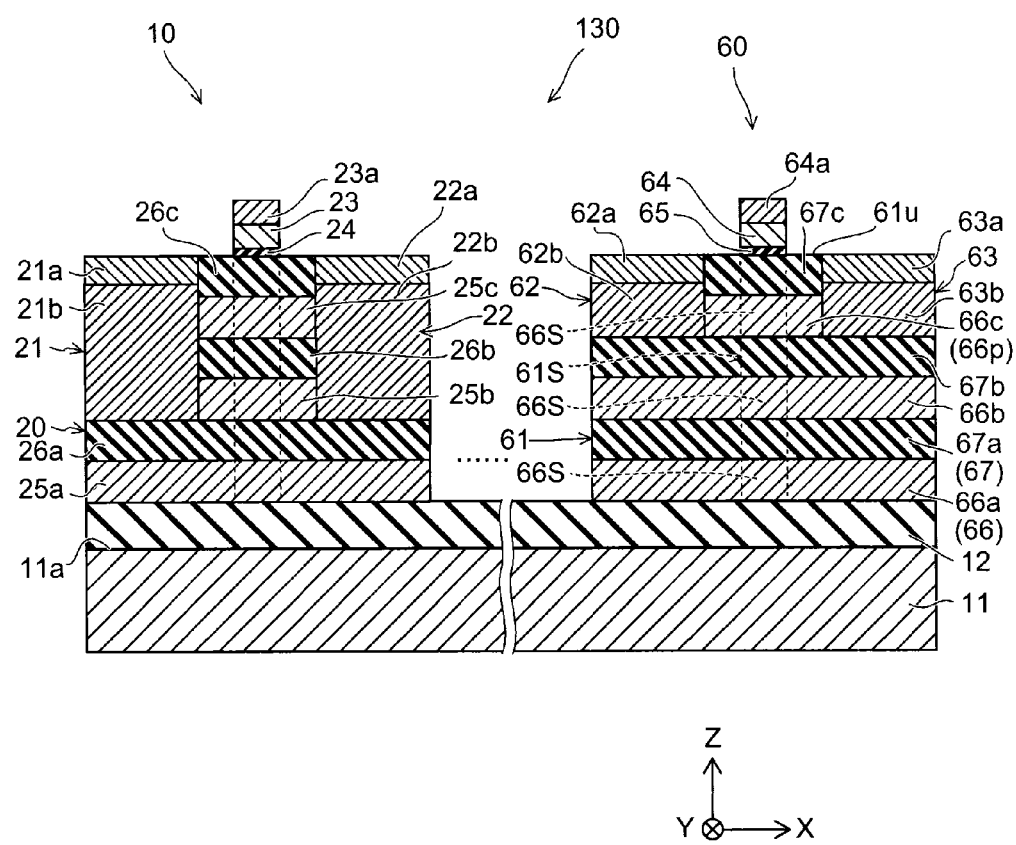
FIG. 10 is a schematic cross-sectional view showing a semiconductor device according to a second embodiment.

FIG. 10 is a schematic cross-sectional view illustrating a semiconductor device according to a second embodiment.

FIG. 10 is a cross-sectional view corresponding to a cross section taken along line B1-B2 of FIG. 1B.

A semiconductor device 130 according to the embodiment further includes a second transistor 60 in addition to the first transistor 10. The second transistor 60 is provided on the major surface 11a of the substrate 11 on which the first transistor 10 is provided.

The configuration of the first transistor 10 may be the same as the configuration described in regard to the first embodiment. The second transistor 60 includes a second stacked body 61, a third conductive section 62, a fourth conductive section 63, a second gate electrode 64, and a second gate insulating film 65. The second stacked body 61 includes a plurality of second semiconductor layers 66a to 66c and a plurality of second insulating layers 67a to 67c alternately stacked along the Z-axis direction.

The third conductive section 62 includes a third silicide portion 62a and a third silicon portion 62b. The fourth conductive section 63 includes a fourth silicide portion 63a and a fourth silicon portion 63b. A silicide portion 64a is provided in an upper portion of the second gate electrode 64. The second semiconductor layers 66a to 66c are collectively referred to as a second semiconductor layer 66. The second insulating layers 67a to 67c are collectively referred to as a second insulating layer 67. Each of the second semiconductor layers 66 has a side surface 66s along the Z-axis direction.

The third conductive section 62 is electrically connected to a second semiconductor layer 66p of at least one of the second semiconductor layers 66. In this example, the third conductive section 62 is electrically connected to the second semiconductor layer 66c. The fourth conductive section 63 is electrically connected to at least the one of the second semiconductor layers 66p mentioned above. In this example, the fourth conductive section 63 is electrically connected to the second semiconductor layer 66c. The fourth conductive section 63 is apart from the third conductive section 62 in a third direction perpendicular to the Z-axis direction. In this example, the third direction is the X-axis direction. That is, the fourth conductive section 63 is apart from the third conductive section 62 in the X-axis direction. However, the third direction is not limited to the X-axis direction but may be an arbitrary direction perpendicular to the Z-axis direction.

The second stacked body 61 has, for example, a rectangular parallelepiped shape. Each of the second semiconductor layer 66 and the second insulating layer 67 has, for example, a substantially rectangular plate shape. For example, the second semiconductor layer 66 and the second insulating layer 67 extend in the third direction (in this example, the X-axis direction). The third conductive section 62 is, for example, provided at one end in the X-axis direction of the second stacked body 61. The fourth conductive section 63 is, for example, provided at the other end in the X-axis direction of the second stacked body 61.

The direction in which the second stacked body 61 extends is not limited to the third direction but may be an arbitrary direction perpendicular to the Z-axis direction. In this example, the second direction of the first transistor 10 is parallel to the third direction of the second transistor 60. However, the embodiment is not limited thereto. For example, the second direction may be intersecting the third direction.

The second gate electrode 64 is provided between the third conductive section 62 and the fourth conductive section 63 in the third direction. The second gate electrode 64 is opposed to two side surfaces 61s in the Y-axis direction (surfaces parallel to the first direction and the third direction) of the second stacked body 61 and the upper surface 61u of the second stacked body 61. In this example, the second gate electrode 64 is disposed in a central region in the third direction (in this example, the X-axis direction) of the second stacked body 61. The second gate electrode 64 is opposed to the side surface 66s (a surface parallel to the first direction and the third direction) of each of the second semiconductor layers 66. The second gate insulating film 65 is provided between the second gate electrode 64 and the second stacked body 61. Therefore, the second gate insulating film 65 is provided between the second gate electrode 64 and the second semiconductor layer 66.

The same material as the material of the first semiconductor layer 25, for example, is used for the second semiconductor layer 66. The thickness of each of the second semiconductor layers 66 is equal to the thickness of each of the first semiconductor layers 25, for example. The same material as the material of the first insulating layer 26, for example, is used for the second insulating layer 67. The thickness of each of the second insulating layers 67 is equal to the thickness of each of the first insulating layers 26. The first semiconductor layer 25 and the second semiconductor layer 66 are formed by, for example, processing the semiconductor film 30 stacked on the substrate 11. The first insulating layer 26 and the second insulating layer 67 are formed by, for example, processing the insulating film 31 stacked on the substrate 11. The distance of each of the second semiconductor layers 66 from the substrate 11 is the same as the distance of each of the first semiconductor layers 25 from the substrate 11.

In the first transistor 10, for example, the first conductive section 21 and the second conductive section 22 are connected to the first semiconductor layers 25b and 25c. In the first transistor 10, the first semiconductor layer 25a is insulated from the first semiconductor layers 25b and 25c by the first insulating layer 26a of the first layer. In the first transistor 10, the first semiconductor layers 25b and 25c function as a channel, and the first semiconductor layer 25a does not function as a channel.

In the second transistor 60, for example, the third conductive section 62 and the fourth conductive section 63 are connected to the second semiconductor layer 66c. In the second transistor 60, the second semiconductor layers 66a and 66b are insulated from the second semiconductor layer 66c by the second insulating layer 67b. In the second transistor 60, the second semiconductor layer 66c functions as a channel, and the second semiconductor layers 66a and 66b do not function as a channel.

In the semiconductor device 130, the number of partial first semiconductor layers 25p electrically connected to the first conductive section 21 and the second conductive section 22 in the first transistor 10 is different from the number of the second semiconductor layers 66p electrically connected to the third conductive section 62 and the fourth conductive section 63 in the second transistor 60. In the semiconductor device 130, for example, the numbers of semiconductor layers connected in the first transistor 10 and the second transistor 60 can be arbitrarily altered in accordance with the characteristics (e.g. the current amount) required for the first transistor 10 and the second transistor 60. In the semiconductor device 130, the footprints of the first transistor 10 and the second transistor 60 do not change even when the number of semiconductor layers connected is changed. In the semiconductor device 130, the characteristics of the first transistor 10 and the second transistor 60 can be improved. Furthermore, costs can be reduced.

A CMOS circuit, for example, can be formed from the semiconductor device according to the embodiment. For example, a p-type transistor is formed from the first transistor 10, and an n-type transistor is formed from the second transistor 60. The number of semiconductor layers connected in the p-type transistor (the first transistor 10) is set larger than the number of semiconductor layers connected in the n-type transistor (the second transistor 60). For example, the former is set approximately twice the latter. Thereby, the imbalance in the current characteristics of the p-type transistor and the current characteristics of the n-type transistor can be eliminated. In an SRAM circuit, for example, the number of semiconductor layers connected is differentiated between a pull-down n-type transistor and a pass-gate n-type transistor. Thereby, the operation margin of the SRAM can be optimized.

A plurality of first transistors 10 may be provided on the major surface 11a of the substrate 11. Furthermore, a plurality of second transistors 60 may be provided on the major surface 11a of the substrate 11. A transistor in which the number of semiconductor layers connected is different from those in the first transistor 10 and the second transistor 60 may be further provided.

FIG. 11A, FIG. 11B, FIG. 12A, and FIG. 12B are schematic views illustrating a method for manufacturing the semiconductor device according to the second embodiment.

Figure 11A:
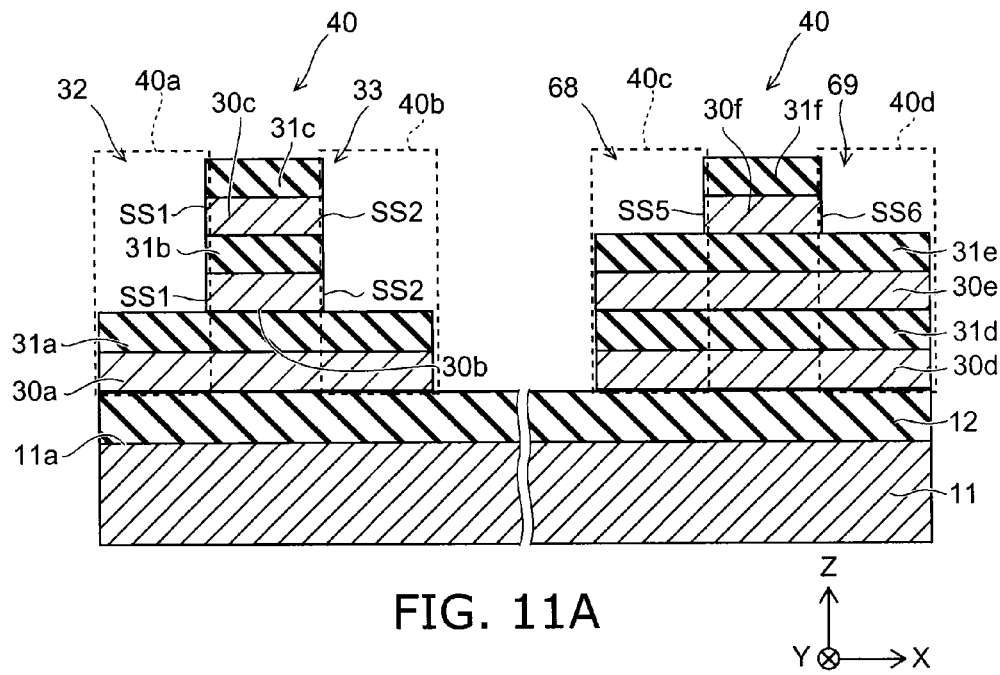
FIG. 11A and FIG. 11B are schematic views showing a method for manufacturing the semiconductor device according to the second embodiment.
Figure 11B:
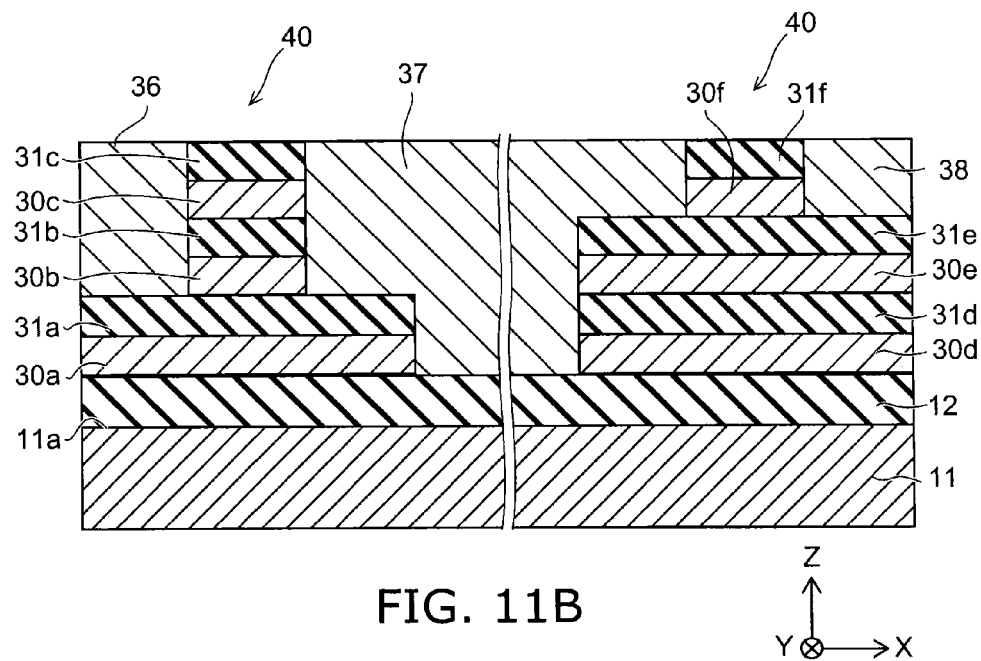
Figure 12A:
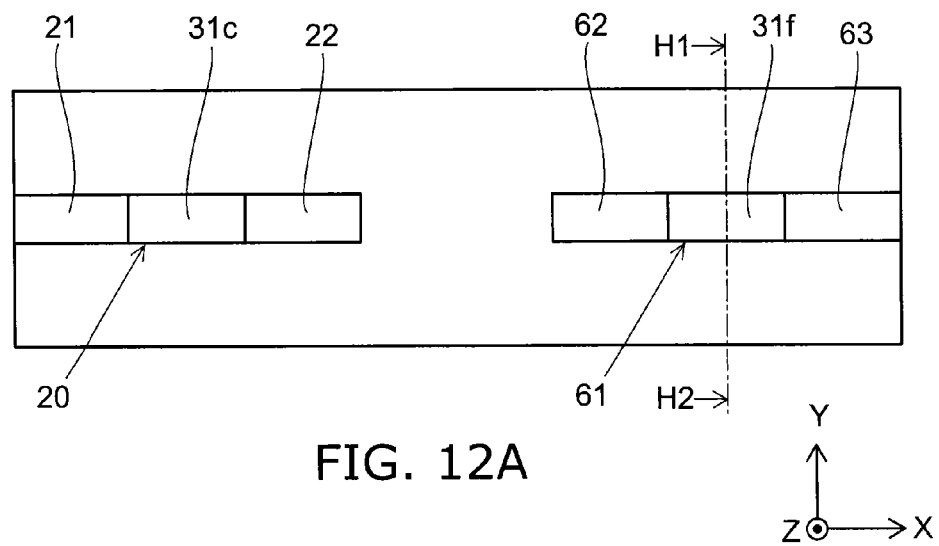
FIG. 12A and FIG. 12B are schematic views showing the method for manufacturing the semiconductor device according to the second embodiment.
Figure 12B:
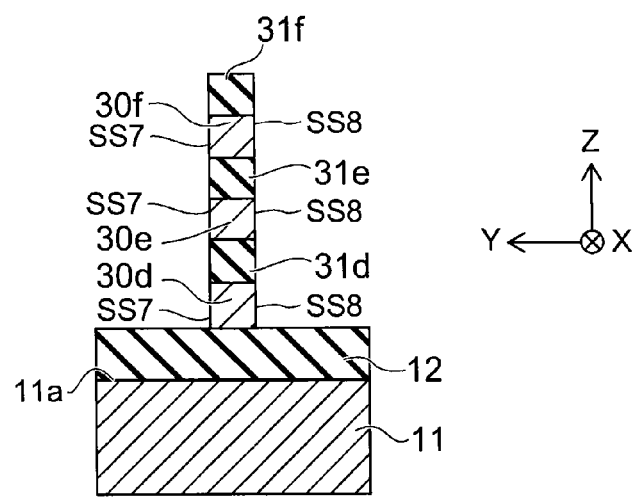

FIG. 11A and FIG. 11B are cross-sectional views corresponding to a cross section taken along line C1-C2 of FIG. 2B. FIG. 12A is a schematic top view. FIG. 12B is a cross-sectional view corresponding to a cross section taken along line H1-H2 of FIG. 12A.

In the method for manufacturing the semiconductor device 130 according to the embodiment, for example, the semiconductor film 30 and the insulating film 31 are alternately stacked in the Z-axis direction on the major surface 11a of the substrate 11 to form the stacked matrix 40 (see FIG. 2A).

As shown in FIG. 11A, the stacked matrix 40 further includes a third region 40c and a fourth region 40d in addition to the first region 40a and the second region 40b. The third region 40c is apart from the first region 40a and the second region 40b. The fourth region 40d is apart from the first region 40a and the second region 40b, and is apart from the third region 40c in the X-axis direction (the third direction) perpendicular to the Z-axis direction (the first direction).

After the stacked matrix 40 is formed, parts of the stacked matrix 40 are removed to form the first removal portion 32 and the second removal portion 33. At this time, at least a part of a third removal portion 68 and at least a part of a fourth removal portion 69 are formed simultaneously with at least a part of the first removal portion 32 and at least a part of the second removal portion 33. Furthermore, at this time, the stacked matrix 40 is separated into a portion corresponding to the first transistor 10 and a portion corresponding to the second transistor 60. Hereinafter, the semiconductor films 30 of the stacked matrix 40 corresponding to the first transistor 10 are referred to as the semiconductor films 30a to 30c. The insulating films 31 of the stacked matrix 40 corresponding to the first transistor 10 are referred to as the insulating films 31a to 31c. The semiconductor films 30 of the stacked matrix 40 corresponding to the second transistor 60 are referred to as semiconductor films 30d to 30f. The insulating films 31 of the stacked matrix 40 corresponding to the second transistor 60 are referred to as insulating films 31d to 31f.

The third removal portion 68 is formed by removing a part of the stacked matrix 40 from the upper surface 40u of the stacked matrix 40 in the third region 40c. A fifth side surface SS5 of at least one of the semiconductor films 30 is exposed to the removal portion 68. In this example, the third removal portion 68 is formed by removing a part of the semiconductor film 30f and a part of the insulating film 31f. The fifth side surface SS5 of the semiconductor film 30f is exposed to the third removal portion 68.

The fourth removal portion 69 is formed by removing a part of the stacked matrix 40 from the upper surface 40u of the stacked matrix 40 in the fourth region 40d. A sixth side surface SS6 of at least one of the semiconductor films 30 is exposed to the fourth removal portion 69. In this example, the fourth removal portion 69 is formed by removing a part of the semiconductor film 30f and a part of the insulating film 31f. The sixth side surface SS6 of the semiconductor film 30f is exposed to the fourth removal portion 69.

The number of semiconductor films 30 exposed at the first side surface SS1 and the second side surface SS2 is different from the number of semiconductor films 30 exposed at the fifth side surface SS5 and the sixth side surface SS6. In this example, the number of semiconductor films 30 exposed at the first side surface SS1 and the second side surface SS2 is two, that is, the semiconductor film 30b and the semiconductor film 30c. On the other hand, the number of semiconductor films 30 exposed at the fifth side surface SS5 and the sixth side surface SS6 is one, that is, the semiconductor film 30f.

As shown in FIG. 11B, a conductive material 36 is buried in the first removal portion 32. A conductive material 37 is buried in the second removal portion 33, the third removal portion 68, and the region between the second removal portion 33 and the third removal portion 68. A conductive material 38 is buried in the fourth removal portion 69. The burying of the conductive materials 36 to 38 may be performed simultaneously, for example.

As shown in FIG. 12A and FIG. 12B, parts of the stacked matrix 40 are removed. Thereby, the first conductive section 21 electrically connected to the first side surface SS1 and the second conductive section 22 electrically connected to the second side surface SS2 are formed. The third conductive section 62 electrically connected to the fifth side surface SS5 and the fourth conductive section 63 electrically connected to the sixth side surface SS6 are formed. The first stacked body 20 including a portion connecting the first region 40a and the second region 40b is formed. In the first stacked body 20, the third side surface SS3 along the first direction (the Z-axis direction) and the second direction (the X-axis direction) and the fourth side surface SS4 on the opposite side to the third side surface SS3 of the semiconductor film 30 are exposed. Furthermore, the second stacked body 61 including a portion connecting the third region 40c and the fourth region 40d is formed. In the second stacked body 61, a seventh side surface SS7 along the first direction (the Z-axis direction) and the third direction (the X-axis direction) and an eighth side surface SS8 on the opposite side to the seventh side surface SS7 of the semiconductor film 30 are exposed.

The first gate electrode 23 and the first gate insulating film 24 are formed by a similar sequence to the first embodiment. At this time, the second gate insulating film 65 is formed on the seventh side surface SS7 and on the eighth side surface SS8. The second gate electrode 64 is formed on the second gate insulating film 65 between the third region 40c (the third conductive section 62) and the fourth region 40d (the fourth conductive section 63).

By the foregoing, the first transistor 10 and the second transistor 60 are formed, and the semiconductor device 130 is completed. Thus, the first stacked body 20 of the first transistor 10 and the second stacked body 61 of the second transistor 60 are formed from the same stacked matrix 40.

As described above, in the method for manufacturing the semiconductor device 130, step S120 of the flow chart shown in FIG. 6 includes forming the third removal portion 68 and the fourth removal portion 69, step S130 includes forming the third conductive section 62 and the fourth conductive section 63, step S140 includes forming the second stacked body 61, step S150 includes forming the second gate insulating film 65, and step S160 includes forming the second gate electrode 64.

Third Embodiment

Figure 13:
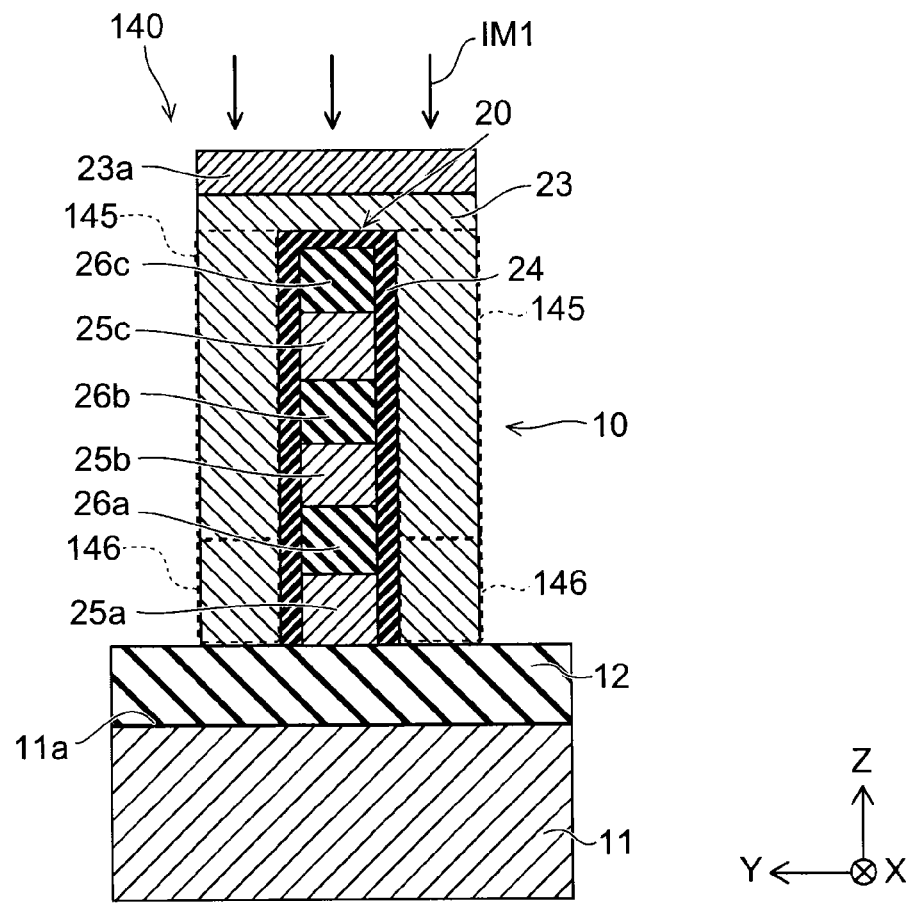
FIG. 13 is a schematic cross-sectional view showing a semiconductor device according to a third embodiment.

FIG. 13 is a schematic cross-sectional view illustrating a semiconductor device according to a third embodiment.

FIG. 13 is a cross-sectional view corresponding to a cross section taken along line A1-A2 of FIG. 1B.

In a semiconductor device 140 according to the embodiment, the first gate electrode 23 of the first transistor 10 includes a high concentration region 145 and a low concentration region 146. The concentration of the impurity in the low concentration region 146 is lower than the concentration of the impurity in the high concentration region 145. The configuration of the semiconductor device 140 other than the first gate electrode 23 is similar to that of the semiconductor device 110.

The high concentration region 145 is opposed to at least one of the first semiconductor layers 25p. In this example, the high concentration region 145 is opposed to the first semiconductor layer 25b and the first semiconductor layer 25c. The low concentration region 146 is opposed to the first semiconductor layers 25 excluding at least the one of first semiconductor layers 25p mentioned above. In this example, the low concentration region 146 is opposed to the first semiconductor layer 25a. The impurity concentration of the high concentration region 145 is, for example, $10^{20}$ cm$^{-3}$ or more. On the other hand, the impurity concentration of the low concentration region 146 is, for example, less than $10^{20}$ cm$^{-3}$. Thus, in the first gate electrode 23, the impurity concentration of the portion opposed to the first semiconductor layers 25b and 25c functioning as a channel is higher than the impurity concentration of the portion opposed to the first semiconductor layer 25a not functioning as a channel.

When the first transistor 10 is the n type, for example, phosphorus or arsenic, which is an n-type impurity, is used as the impurity of the first gate electrode 23. On the other hand, when the first transistor 10 is the p type, for example, boron, which is a p-type impurity, is used as the impurity of the first gate electrode 23.

In the semiconductor device 140, the high concentration region 145 is provided in a portion of the first gate electrode 23 opposed to the first semiconductor layers 25b and 25c functioning as a channel. The high concentration region 145 is doped with a relatively high concentration impurity. Hence, in the portion of the high concentration region 145, the controllability of the first gate electrode 23 to the channel is ensured, and appropriate operations are obtained. On the other hand, in the semiconductor device 140, the low concentration region 146 is provided in a portion opposed to the first semiconductor layer 25a not functioning as a channel. Hence, in the portion of the low concentration region 146, even when a voltage is applied to the first gate electrode 23, a depletion layer extends in the low concentration region 146 and the portion does not function as the first gate electrode 23 sufficiently. Therefore, in the semiconductor device 140, the gate capacitance can be reduced, and the operating speed of the first transistor 10 is improved.

When the semiconductor device 140 is manufactured, for example, the first gate insulating film 24 and the first gate electrode 23 are formed by a similar sequence to the first embodiment (see FIGS. 5A to 5C).

After that, as shown in FIG. 13, a first ion implantation IM1 is performed from above to implant an impurity into the first gate electrode 23. After the first ion implantation IM1 is performed, heat treatment is performed to diffuse the implanted impurity down to a portion opposed to the first semiconductor layer 25b. Thereby, the low concentration region 146 is formed in a portion opposed to the first semiconductor layer 25a, and the high concentration region 145 is formed in a portion opposed to the first semiconductor layers 25b and 25c. After that, the first transistor 10 is formed by a similar sequence to the semiconductor device 110; thus, the semiconductor device 140 is completed.

The implantation direction of the first ion implantation IM1 and the Z-axis direction (the first direction) are set substantially parallel to each other, for example. The absolute value of the angle between them is set not less than 0 degrees and less than 7 degrees, for example. Thereby, in the first ion implantation IM1 into the first gate electrode 23, introduction of an impurity into the entire first gate electrode 23 is suppressed. The implantation angle, acceleration voltage, and dose of the first ion implantation IM1, and the conditions of the heat treatment after the first ion implantation IM1 are appropriately adjusted in accordance with the number of first semiconductor layers 25 where an impurity is to be diffused and the number of first insulating layers 26.

Fourth Embodiment

Figure 14A:
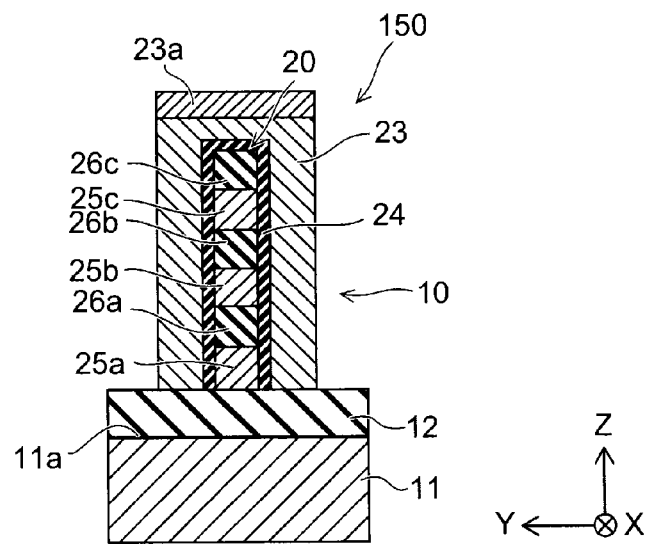
FIG. 14A and FIG. 14B are schematic cross-sectional views showing a semiconductor device according to a fourth embodiment.
Figure 14B:
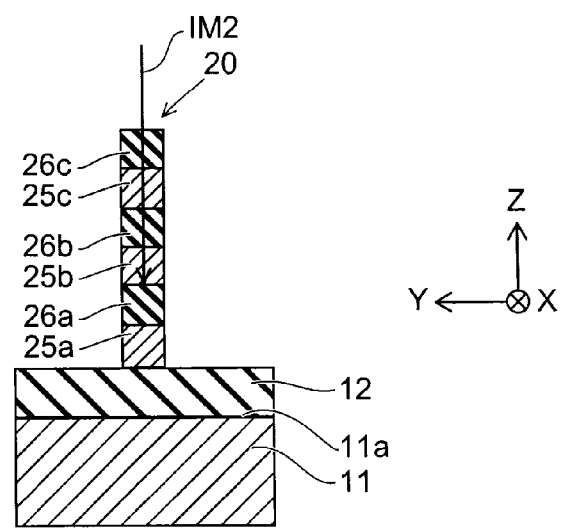

FIG. 14A and FIG. 14B are schematic cross-sectional views illustrating a semiconductor device according to a fourth embodiment.

FIG. 14A and FIG. 14B are cross-sectional views corresponding to a cross section taken along line A1-A2 of FIG. 1B in the semiconductor device 110.

In the first transistor 10 of a semiconductor device 150 according to the embodiment, there is a difference in the concentration of the impurities of the first semiconductor layers 25a to 25c. The configuration of the semiconductor device 150 other than the first semiconductor layer 25 is similar to that of the semiconductor device 110.

The concentration of the impurity of a portion opposed to the first gate electrode 23 of the first semiconductor layers 25p is, for example, $10^{18}$ cm$^{-3}$ or more. In this example, the concentration of the impurity of a portion opposed to the first gate electrode 23 of the first semiconductor layers 25b and 25c is $10^{18}$ cm$^{-3}$ or more, for example.

On the other hand, the concentration of the impurity of a portion opposed to the first gate electrode 23 of the first semiconductor layers 25 excluding the portion opposed to the first gate electrode mentioned above out of the first semiconductor layers 25 is, for example, less than $10^{18}$ cm$^{-3}$. In this example, the concentration of the impurity of a portion opposed to the first gate electrode 23 of the first semiconductor layer 25a is less than $10^{18}$ cm$^{-3}$, for example.

When the first transistor 10 is the n type, for example, an n-type impurity such as phosphorus and arsenic is used as the impurity of the first semiconductor layer 25. When the first transistor 10 is the p type, for example, a p-type impurity such as boron is used as the impurity of the first semiconductor layer 25. When the first transistor 10 is the n type or the p type, germanium may be used as the impurity.

When the first transistor 10 is the n type, for example, a p-type impurity such as boron is used as the impurity of the first gate electrode 23. On the other hand, when the first transistor 10 is the p type, for example, an n-type impurity such as phosphorus and arsenic is used as the impurity of the first gate electrode 23. The concentration of the impurity of the first gate electrode 23 is, for example, $10^{20}$ cm$^{-3}$ or more in a portion opposed to each of the first semiconductor layer 25 and the first insulating layer 26.

When the first transistor 10 is the n type, for example, the first semiconductor layers 25b and 25c functioning as a channel are doped with a relatively high concentration n-type impurity or germanium. Thereby, the first semiconductor layers 25b and 25c enter a situation where electrons are likely to be induced, in other words, a situation where the threshold voltage as the first transistor 10 is low. In the case of germanium doping, for example, the size of the polysilicon grain is increased by the doping with germanium. Consequently, the increase in the threshold voltage due to a grain boundary (crystal grain boundary) charge is suppressed.

On the other hand, in the first semiconductor layer 25a not functioning as a channel, only a relatively low concentration impurity is included as compared to the first semiconductor layers 25b and 25c. Therefore, the first semiconductor layer 25a is in a situation where electrons are less likely to be induced, in other words, a situation where the threshold voltage as the first transistor 10 is high.

In the semiconductor device 150, for example, when the first transistor 10 is operated, the ON voltage applied to the first gate electrode 23 is set higher than the threshold voltage of the first semiconductor layers 25b and 25c and lower than the threshold voltage of the first semiconductor layer 25a. Thereby, electrons are induced in the first semiconductor layers 25b and 25c, and electrons are not induced in the first semiconductor layer 25a. Thereby, the capacitance between the gate and the first semiconductor layer 25a can be reduced, and the operating speed of the first transistor 10 is improved.

At this time, a p-type impurity is used as the impurity of the first gate electrode 23. Thus, the threshold voltage of the first semiconductor layer 25a is higher than 0 V, and practicable setting of the ON voltage of 0 V or more is possible.

When the semiconductor device 150 according to the embodiment is manufactured, for example, a part of amorphous silicon layers and the like is etched to form the first stacked body 20 (see FIG. 4A and FIG. 4B).

After that, as shown in FIG. 14B, a second ion implantation IM2 is performed from above to implant an impurity into the first stacked body 20. After that, heat treatment is performed to diffuse the implanted impurity into the first semiconductor layers 25b and 25c. After that, the first transistor 10 is formed by a similar sequence to the semiconductor device 110. Thus, the semiconductor device 150 is completed.

The absolute value of the angle between the implantation direction of the second ion implantation IM2 and the Z-axis direction (the first direction) is set not less than 0 degrees and less than 7 degrees, for example. Thereby, in the second ion implantation IM2 into the first stacked body 20, introduction of an impurity into the entire first stacked body 20 is suppressed. The implantation angle, acceleration voltage, and dose of the second ion implantation IM2, and the conditions of the heat treatment after the second ion implantation IM2 are appropriately adjusted in accordance with the number of semiconductor layers where an impurity is to be diffused.

Fifth Embodiment

Figure 15A:
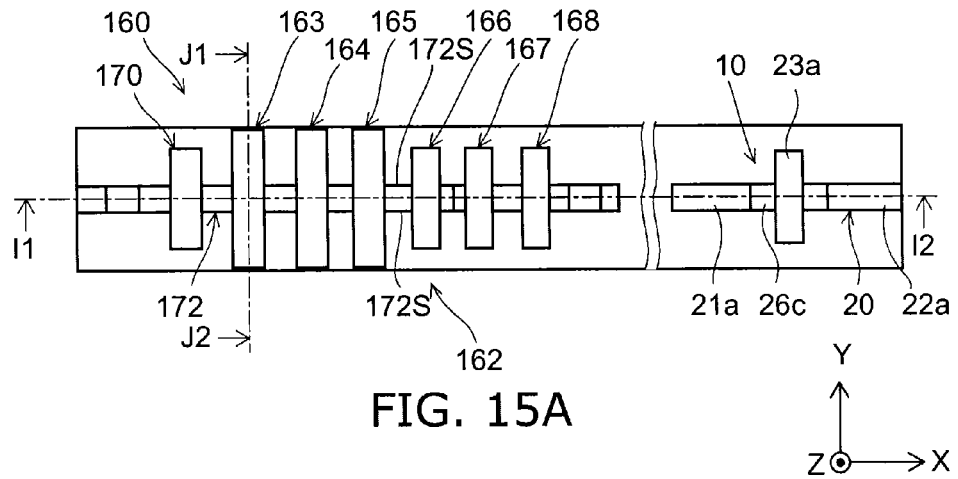
FIG. 15A to FIG. 15C are schematic views showing a semiconductor device according to a fifth embodiment.
Figure 15B:
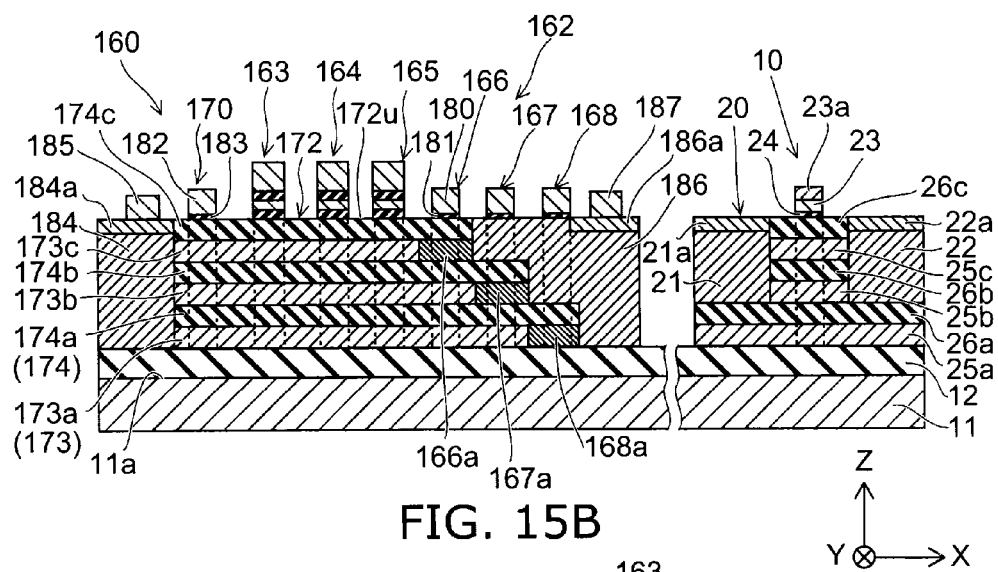
Figure 15C:
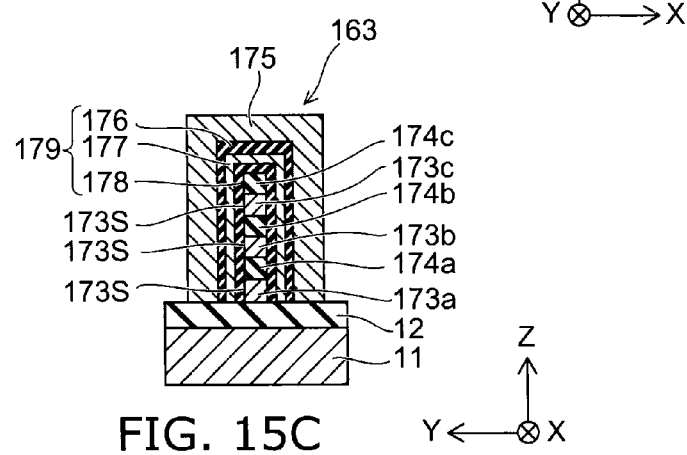

FIG. 15A to FIG. 15C are schematic views illustrating a semiconductor device according to a fifth embodiment.

FIG. 15A is a schematic top view, and FIG. 15B and FIG. 15C are schematic cross-sectional views. FIG. 15B schematically shows a cross section taken along line 11-12 of FIG. 15A. FIG. 15C schematically shows a cross section taken along line J1-J2 of FIG. 15A.

As shown in FIG. 15A and FIG. 15B, in a semiconductor device 160 according to the embodiment, the first transistor 10 described in regard to the first embodiment and a first memory unit 162 (a memory unit) are provided on the substrate 11. The first transistor 10 is, for example, included in a peripheral circuit of the first memory unit 162. The first transistor 10 is used for, for example, the control of the voltage applied to the first memory unit 162.

The first memory unit 162 includes, for example, first to third memory strings 163 to 165, first to third layer select transistors 166 to 168, and a source-side select gate transistor 170. The first memory unit 162 is a vertical gate stacked memory.

The first memory unit 162 includes a third stacked body 172. The third stacked body 172 is shared among the first to third memory strings 163 to 165, the first to third layer select transistor strings 166 to 168, and the source-side select gate transistor 170. The third stacked body 172 includes a plurality of third semiconductor layers 173a to 173c and a plurality of third insulating layers 174a to 174c alternately stacked along the Z-axis direction. The third semiconductor layers 173a to 173c are collectively referred to as a third semiconductor layer 173. The third insulating layers 174a to 174c are collectively referred to as a third insulating layer 174. Each of the third semiconductor layers 173 has a side surface 173s along the Z-axis direction.

The third stacked body 172 extends along a fourth direction perpendicular to the Z-axis direction. In this example, the fourth direction is the X-axis direction. However, the fourth direction may be an arbitrary direction perpendicular to the Z-axis direction. In this example, the second direction of the first transistor 10 is parallel to the fourth direction of the first memory unit 162. The second direction may be intersecting the fourth direction.

The same material as the material of the first semiconductor layer 25, for example, is used for the third semiconductor layer 173. The thickness of each of the third semiconductor layers 173 is, for example, equal to the thickness of each of the first semiconductor layers 25. The first semiconductor layer 25 and the third semiconductor layer 173 are formed by, for example, processing the semiconductor film 30 stacked on the substrate 11. The same material as the material of the first insulating layer 26, for example, is used for the third insulating layer 174. The thickness of each of the third insulating layers 174 is, for example, equal to the thickness of each of the first insulating layers 26. The first insulating layer 26 and the third insulating layer 174 are formed by, for example, processing the insulating film 31 stacked on the substrate 11. The distance of each of the third semiconductor layers 173 from the substrate 11 is the same as the distance of each of the first semiconductor layers 25 from the substrate 11.

The first memory string 163 includes a control gate electrode 175 and a first memory film 179. The first memory film 179 includes a first outer insulating film 176, a first charge storage layer 177, and a first inner insulating film 178.

The control gate electrode 175 and the first memory film 179 are formed in a similar configuration to the first gate electrode 23 and the first gate insulating film 24 of the first transistor 10, for example. The control gate electrode 175 and the first memory film 179 are opposed to two side surfaces 172s in the Y-axis direction (surfaces parallel to the first direction and the fourth direction) of the third stacked body 172 and the upper surface 172u of the third stacked body 172. The control gate electrode 175 and the first memory film 179 are opposed to side surfaces 173s (surfaces parallel to the first direction and the fourth direction) of each of the third semiconductor layers 173.

The first inner insulating film 178 is provided between the third stacked body 172 and the control gate electrode 175. The first inner insulating film 178 is, for example, in contact with the third stacked body 172. The first charge storage layer 177 is provided between the control gate electrode 175 and the first inner insulating film 178. The first charge storage layer 177 is, for example, in contact with the first inner insulating film 178. The first outer insulating film 176 is provided between the control gate electrode 175 and the first charge storage layer 177. The first outer insulating film 176 is, for example, in contact with the control gate electrode 175 and in contact with the first charge storage layer 177.

As the control gate electrode 175, for example, a polysilicon single film, a metal semiconductor compound single film, a metal film, a stacked film, or the like is used. As the metal semiconductor compound single film, for example, metal silicide or the like is used. As the metal film, TiN, W, TaC, and the like are given. As the stacked film, for example, a stacked film of a metal semiconductor compound film and a semiconductor such as a polysilicon film, a stacked film of a metal film and a semiconductor such as a polysilicon film, or the like is given.

As the first outer insulating film 176 and the first inner insulating film 178, for example, a silicon oxide film, a silicon oxynitride film, a high dielectric film (a high-k film), a stacked film, or the like is used. As the high dielectric film, for example, a hafnium oxide film, a zirconium oxide film, and the like are given. As the stacked film, for example, a stacked film of a silicon oxide film and a high dielectric film and the like are given. As the first charge storage layer 177, for example, a silicon nitride film, a high dielectric film (a high-k film), a polysilicon film, or the like is used.

The first memory film 179 forms a memory cell that stores information together with the control gate electrode 175. In the first memory string 163, portions of the third semiconductor layers 173 opposed to the control gate electrode 175 and the first memory film 179 each function as a memory cell. That is, three memory cells aligned in the Z-axis direction are formed in the first memory string 163. In each of the memory cells, information of one bit or a plurality of bits is stored by changing the flowing condition of current in accordance with the charge stored in the first charge storage layer 177.

The first memory film 179 is not limited to one including the first outer insulating film 176, the first charge storage layer 177, and the first inner insulating film 178. The first memory film 179 may include a dot-like charge storage layer. The first outer insulating film 176 may be a stacked film. The first charge storage layer 177 may be a stacked film. The first inner insulating film 178 may be a stacked film. The first memory film 179 may be provided only in a portion opposed to the side surface 173s of each of the third semiconductor layers 173, for example. Furthermore, for example, only the first inner insulating film 178 of the first memory film 179 may be provided only in a portion opposed to the side surface 173s. The first memory film 179 needs only to be capable of forming a memory cell.

The configuration of the second memory string 164 and the third memory string 165 is the same as the configuration of the first memory string 163, for example. The second memory string 164 and the third memory string 165 include a plurality of (in this example, three) memory cells aligned along the Z-axis direction. That is, in this example, a total of nine memory cells are included in the first memory unit 162. In the first memory unit 162, three memory cells included in the third semiconductor layer 173a are connected in series. Similarly, also three memory cells included in each of the third semiconductor layers 173b and 173c are connected in series.

The number of memory cells is not limited to three but may be one or two. Four or more is also possible. In the first memory unit 162, the number of memory cells may be arbitrarily set in accordance with the number of the stacked layers in the third stacked body 172 and the number of memory strings provided in the third stacked body 172.

The first layer select transistor 166, the second layer select transistor 167, and the third layer select transistor 168 are connected in series to the first memory string 163, the second memory string 164, and the third memory string 165, respectively. The first layer select transistor 166, the second layer select transistor 167, and the third layer select transistor 168 each include a gate electrode 180 and a gate insulating film 181. The configuration of the gate electrode 180 and the gate insulating film 181 may be similar to the configuration of the first gate electrode 23 and the first gate insulating film 24 of the first transistor 10.

In the first layer select transistor 166, a first normally ON region 166a is provided in a portion where the gate electrode 180 and the third semiconductor layer 173c are opposed. In the second layer select transistor 167, a second normally ON region 167a is provided in a portion where the gate electrode 180 and the third semiconductor layer 173b are opposed. In the third layer select transistor 168, a third normally ON region 168a is provided in a portion where the gate electrode 180 and the third semiconductor layer 173a are opposed. The first normally ON region 166a to the third normally ON region 168a are regions doped with a high concentration impurity, and are in a short circuit state irrespective of the voltage applied to the gate electrode 180.

When the first memory unit 162 is operated, for example, an OFF voltage is applied to the gate electrode 180 of one of the first layer select transistor 166 to the third layer select transistor 168, and an ON voltage is applied to the other gate electrodes 180. Thereby, the memory cells of the third semiconductor layer 173 that is short-circuited in one of the first normally ON region 166a to the third normally ON region 168a formed in the one of the first layer select transistor 166 to the third layer select transistor 168 to which the OFF voltage is applied can be selected. For example, when the memory cells aligned in the third semiconductor layer 173c are selected, an OFF voltage is applied to the gate electrode 180 of the first layer select transistor 166, and an ON voltage is applied to the gate electrodes 180 of the second layer select transistor 167 and the third layer select transistor 168.

The source-side select gate transistor 170 is connected in series to the first memory string 163, the second memory string 164, and the third memory string 165 on the opposite side to the first layer select transistor 166, the second layer select transistor 167, and the third layer select transistor 168. The source-side select gate transistor 170 includes a gate electrode 182 and a gate insulating film 183. The configuration of the gate electrode 182 and the gate insulating film 183 may be similar to the configuration of the first gate electrode 23 and the first gate insulating film 24 of the first transistor 10.

The gate electrode 182 and the gate insulating film 183 are opposed to two side surfaces 172S in the Y-axis direction of the third stacked body 172 and the upper surface 172u of the third stacked body 172. The gate electrode 182 is opposed to the side surfaces 173S on both sides in the Y-axis direction of each of the third semiconductor layers 173. When the first memory unit 162 is operated, for example, an ON voltage is applied to the gate electrode 182 of the source-side select gate transistor 170. Thereby, all of the first memory string 163 to the third memory string 165 can be selected.

In the source (a memory source 184) of the source-side select gate transistor 170, a silicide portion 184a is formed in an upper portion thereof. A source line 185 is connected to the silicide portion 184a. In the drain (a memory drain 186) of the third layer select transistor 168, a silicide portion 186a is formed in an upper portion of the memory drain 186. A bit line 187 is connected to the silicide portion 186a.

In this example, the first stacked body 20 of the first transistor 10 is aligned with the third stacked body 172 of the first memory unit 162 in the X-axis direction. However, in the embodiment, the relationship between the extending direction of the first stacked body 20 and the extending direction of the third stacked body 172 is arbitrary.

An example of a method for manufacturing the semiconductor device 160 according to the embodiment will now be described.

FIG. 16A to FIG. 16C, FIG. 17A and FIG. 17B, FIG. 18A and FIG. 18B, FIG. 19A to FIG. 19C, and FIG. 20A to FIG. 20C are schematic views illustrating the method for manufacturing the semiconductor device according to the fifth embodiment.

Figure 16A:
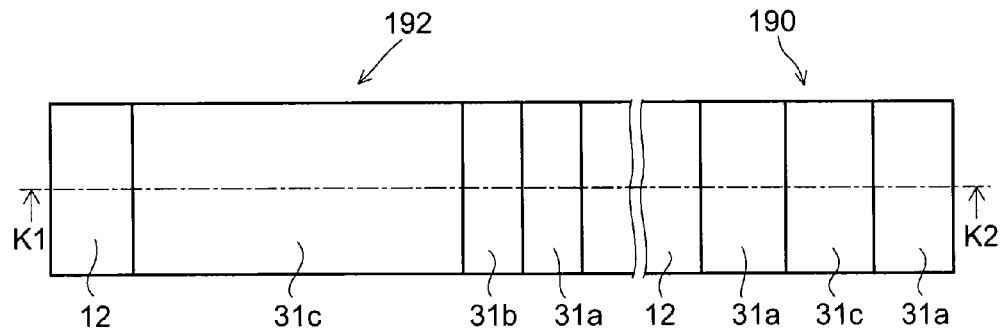
FIG. 16A to FIG. 16C are schematic views showing a method for manufacturing the semiconductor device according to the fifth embodiment.
Figure 16B:
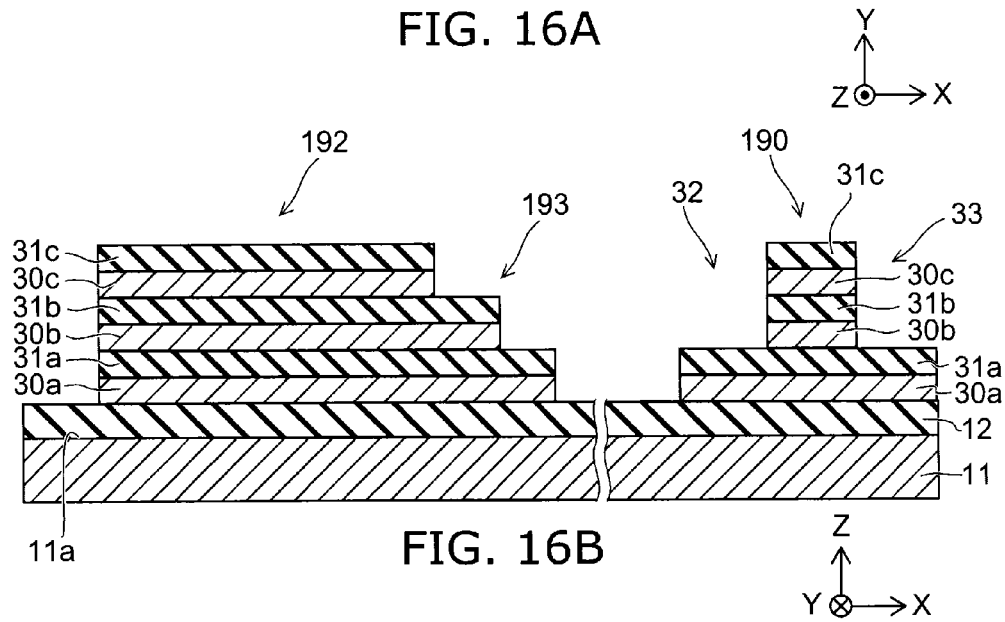
Figure 16C:
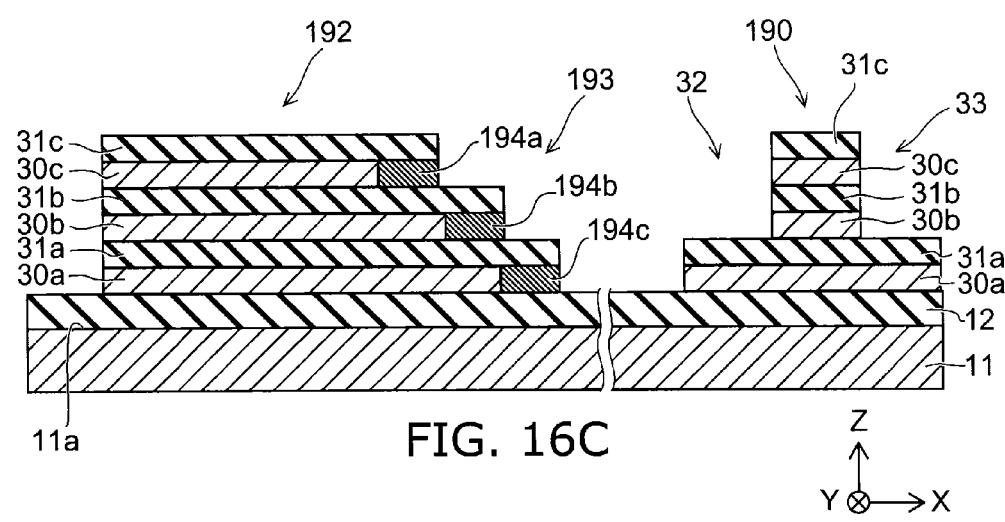
Figure 17A:
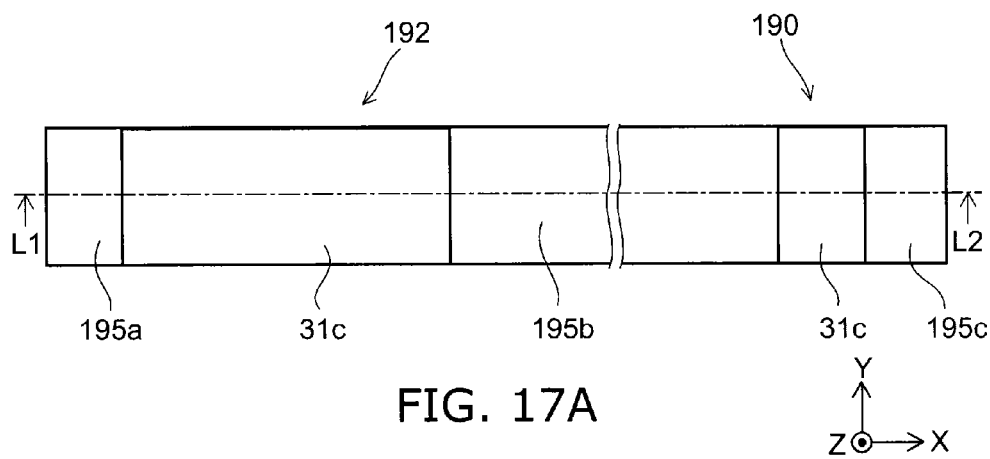
FIG. 17A and FIG. 17B are schematic views showing the method for manufacturing the semiconductor device according to the fifth embodiment.
Figure 17B:
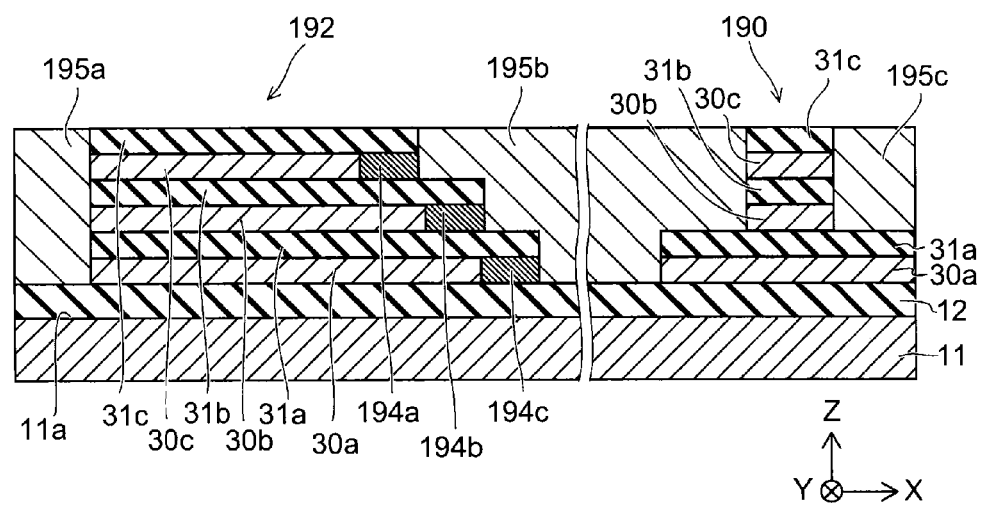
Figure 18A:
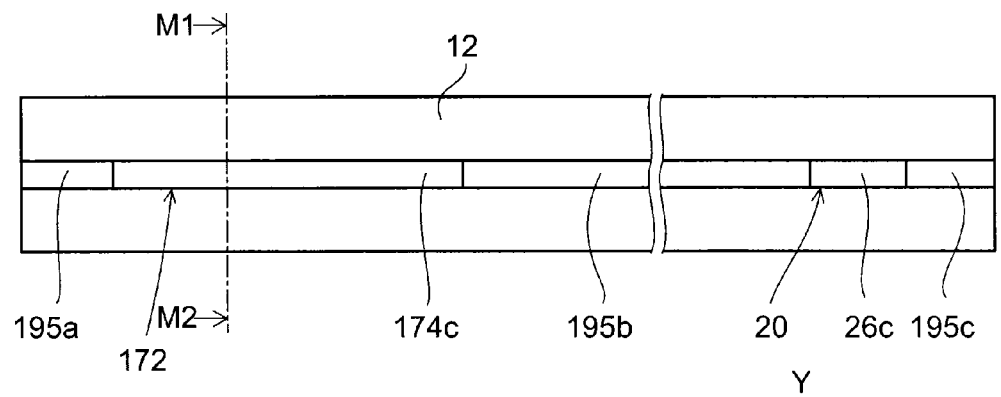
FIG. 18A and FIG. 18B are schematic views showing the method for manufacturing the semiconductor device according to the fifth embodiment.
Figure 18B:
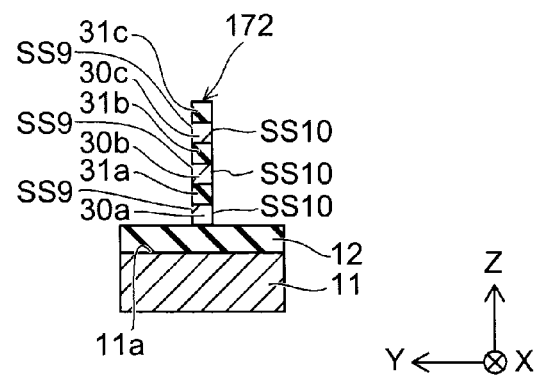
Figure 19A:
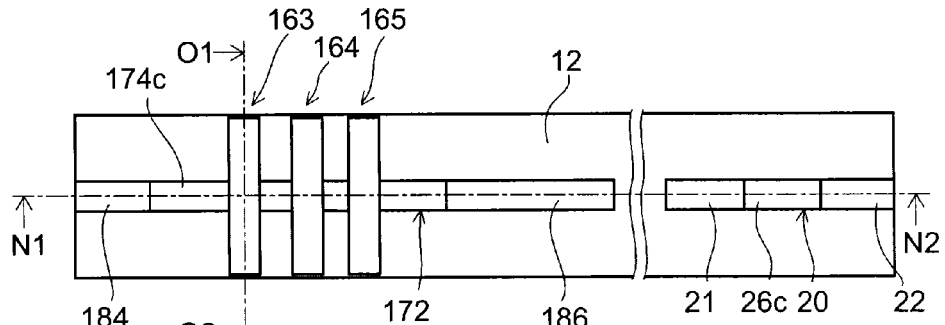
FIG. 19A to FIG. 19C are schematic views showing the method for manufacturing the semiconductor device according to the fifth embodiment.
Figure 19B:
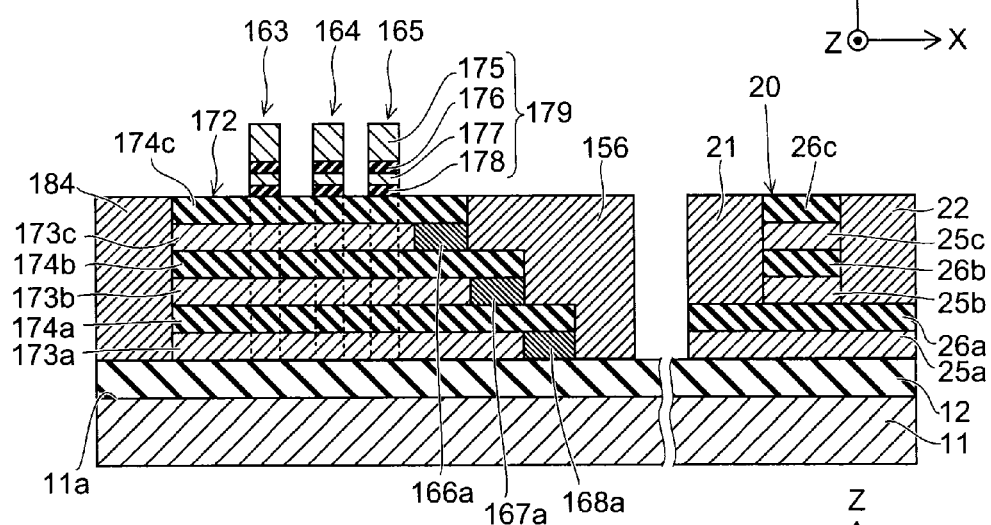
Figure 19C:
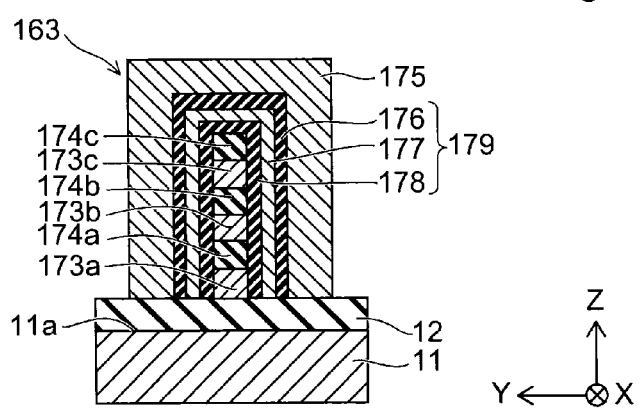
Figure 20A:
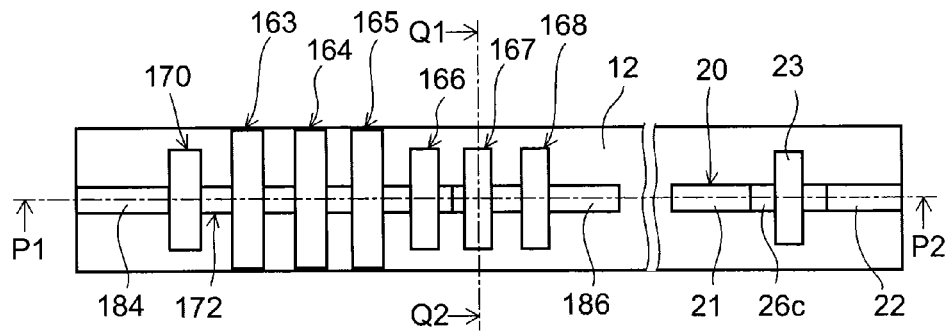
FIG. 20A to FIG. 20C are schematic views showing the method for manufacturing the semiconductor device according to the fifth embodiment.
Figure 20B:
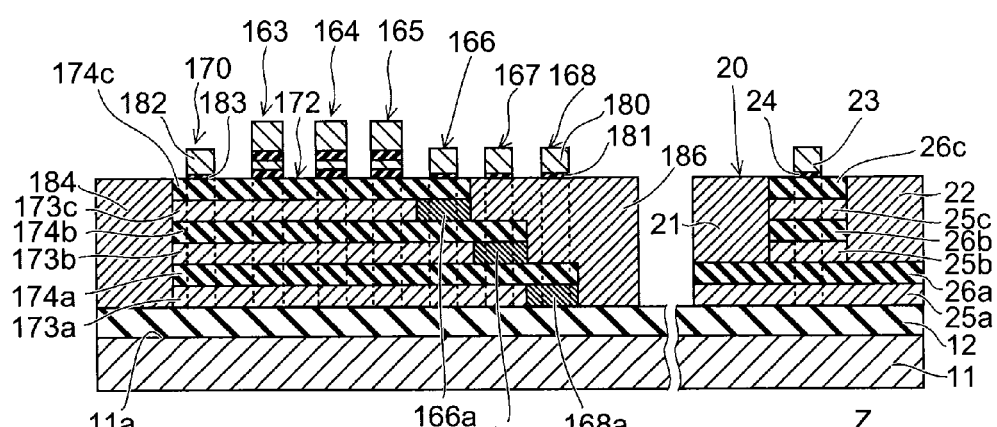
Figure 20C:
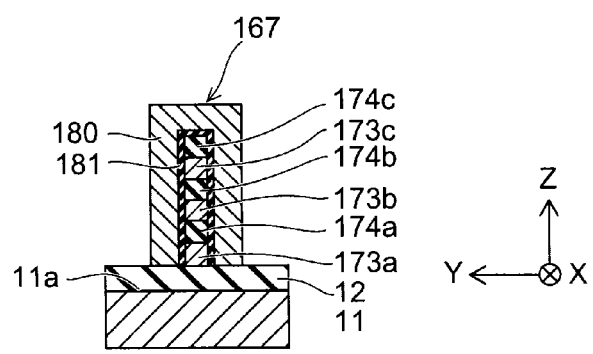

FIG. 16A is a schematic top view, FIG. 16B is a schematic cross-sectional view (a cross-sectional view taken along line K1-K2 of FIG. 16A), and FIG. 16C is a schematic cross-sectional view (a cross-sectional view taken along line K1-K2 of FIG. 16A). FIG. 17A is a schematic top view, and FIG. 17B is a schematic cross-sectional view (a cross-sectional view taken along line L1-L2 of FIG. 17A). FIG. 18A is a schematic top view, and FIG. 18B is a schematic cross-sectional view (a cross-sectional view taken along line M1-M2 of FIG. 18A). FIG. 19A is a schematic top view, FIG. 19B is a schematic cross-sectional view (a cross-sectional view taken along line N1-N2 of FIG. 19A), and FIG. 19C is a schematic cross-sectional view (a cross-sectional view taken along line O1-O2 of FIG. 19A). FIG. 20A is a schematic top view, FIG. 20B is a schematic cross-sectional view (a cross-sectional view taken along line P1-P2 of FIG. 20A), and FIG. 20C is a schematic cross-sectional view (a cross-sectional view taken along line Q1-Q2 of FIG. 20A).

When the semiconductor device 160 is manufactured, first, for example similarly to the semiconductor device 110, the interlayer insulating film 12 is formed on the major surface 11a of the substrate 11, and the stacked matrix 40 is formed thereon (see FIG. 2A).

As shown in FIG. 16A and FIG. 16B, parts of the stacked matrix 40 are removed. Thereby, a first transistor matrix 190 corresponding to the first transistor 10 and a first memory matrix 192 corresponding to the first memory unit 162 are formed from the stacked matrix 40. In the first transistor matrix 190, the first removal portion 32 and the second removal portion 33 are formed. A stair portion 193 for forming the first normally ON region 166a to the third normally ON region 168a in each of the first layer select transistor 166 to the third layer select transistor 168 is formed in the first memory matrix 192.

In the stair portion 193, at one end in the X-axis direction, the length in the X-axis direction of the semiconductor film 30b and the insulating film 31b is shorter than the length in the X-axis direction of the semiconductor film 30a and the insulating film 31a. The length in the X-axis direction of the semiconductor film 30c and the insulating film 31c is shorter than the length in the X-axis direction of the semiconductor film 30b and the insulating film 31b.

In the semiconductor device 160, the stair portion 193 of the first memory unit 162, and the first removal portion 32 and the second removal portion 33 of the first transistor 10 can be formed simultaneously. Thereby, the number of manufacturing processes and process costs can be reduced in the semiconductor device 160.

As shown in FIG. 16C, an end portion on the stair portion 193 side of the semiconductor film 30 is doped with an impurity. The end portions on the stair portion 193 side of the semiconductor films 30 are regions functioning as the first normally ON region 166a to the third normally ON region 168a of the first layer select transistor 166 to the third layer select transistor 168. Thereby, short circuit regions 194a to 194c serving as bases for the first normally ON region 166a to the third normally ON region 168a are formed in the end portions on the stair portion 193 side of the conductive films 30.

As shown in FIG. 17A and FIG. 17B, after the short circuit regions 194a to 194c are formed, conductive materials 195a to 195c are buried in the regions removed in the process of FIG. 16A and FIG. 16B. The burying process is performed by, for example, depositing an amorphous silicon layer over the entire wafer and then planarizing the surface by CMP.

As shown in FIG. 18A and FIG. 18B, a part of the first transistor matrix 190 is removed to form the first stacked body 20 from the first transistor matrix 190. A part of the first memory matrix 192 is removed to form the third stacked body 172. A ninth side surface SS9 along the first direction (the Z-axis direction) and the fourth direction (in this example, the X-axis direction) and a tenth side surface SS10 on the opposite side to the ninth side surface SS9 of the semiconductor film 30 in the third stacked body 172 are exposed. After that, performing heat treatment crystallizes the semiconductor film 30 and the conductive materials 195a to 195c into polysilicon layers to form the first semiconductor layer 25 and the third semiconductor layer 173. The heat treatment may be performed before the first stacked body 20 and the third stacked body 172 are formed.

As shown in FIG. 19A to FIG. 19C, the first memory film 179 is formed on the ninth side surface SS9 and on the tenth side surface SS10. In the formation of the first memory film 179, for example, the first inner insulating film 178, the first charge storage layer 177, and the first outer insulating film 176 are formed in this order. After that, the control gate electrode 175 is formed on the first memory film 179. The control gate electrode 175 and the first memory film 179 are formed by, for example, performing film growth process and etching process on the third stacked body 172. Thereby, the first memory string 163 to the third memory string 165 are formed.

As shown in FIG. 20A to FIG. 20C, for example, film growth processing is performed, and a material that forms the gate insulating film and a material that forms the gate electrode are deposited in this order on the first stacked body 20 and the third stacked body 172. After that, for example, etching process is performed to form the first gate electrode 23, the first gate insulating film 24, the gate electrode 180, the gate insulating film 181, the gate electrode 182, and the gate insulating film 183. Thereby, the third stacked body 172 provided with the first layer select transistor 166 to the third layer select transistor 168 and the source-side select gate transistor 170 is formed.

Further, upper portions of the first conductive section 21, the second conductive section 22, the memory source 184, and the memory drain 186 are silicided to form the first silicide portion 21a, the second silicide portion 22a, and the silicide portions 184a and 186a. Then, the source line 185 is formed on the silicide portion 184a, and the bit line 187 is formed on the silicide portion 186a.

Thus, the semiconductor device 160 is completed.

There is a configuration in which a peripheral circuit of the first memory unit 162 is formed in an underlayer of the first memory unit 162. In this case, the peripheral circuit may be adversely affected by the heat generated when the first memory unit 162 is formed. Thus, thermal loads are applied to the peripheral circuit by the formation of the first memory unit 162. If the heat treatment in forming the first memory unit 162 is suppressed for fear of adverse effects on the peripheral circuit, sufficient high performance is not obtained in the first memory unit 162.

In contrast, in the semiconductor device 160 according to the embodiment, the third stacked body 172 of the first memory unit 162 and the first stacked body 20 of the first transistor 10, which is a peripheral circuit of the first memory unit 162, are formed from the same stacked matrix 40. Consequently, in the semiconductor device 160, there are no restrictions of thermal loads like those in the case where a peripheral circuit is formed in an underlayer of the first memory unit 162. Therefore, in the semiconductor device 160, sufficient thermal loads can be applied for the formation of the first memory unit 162, and high performance can be obtained in the first memory unit 162. Furthermore, since high thermal loads can be applied, the silicide portions 184a and 186a can be formed in upper portions of the memory source 184 and the memory drain 186. Thereby, the parasitic resistance is reduced and the operating speed is improved.

In the semiconductor device 160, the stack structure of the third stacked body 172 of the first memory unit 162 is the same as the stack structure of the first stacked body 20 of the first transistor 10 included in the peripheral circuit of the first memory unit 162. Therefore, in the semiconductor device 160, a large number of manufacturing processes can be shared. On the other hand, in the case of a reference example in which the peripheral circuit of the first memory unit 162 is fabricated using a bulk planar transistor that is different from the first memory unit 162, the sharing of manufacturing processes is difficult. In contrast, in the semiconductor device 160, the number of manufacturing processes and process costs can be significantly reduced.

In the semiconductor device 160, by increasing the number n of the stacked layers in the third stacked body 172, the number of storable bits of memory can be increased without increasing the footprint of the first memory unit 162. Therefore, in the semiconductor device 160, the integration degree of the first memory unit 162 is improved. Furthermore, costs can be reduced.

In the semiconductor device 160, by adopting a structure in which the third stacked body 172 and the first memory string 163 to the third memory string 165 provided in the third stacked body 172 are plurally aligned in parallel in the Y-axis direction, the number of storable bits of memory can be further increased.

In the semiconductor device 160, the layout of the first memory unit 162 and the peripheral circuit (the first transistor 10) is the same as the layout of a memory unit and a peripheral circuit unit formed in a conventional bulk single layer. Therefore, conventional circuit layouts can be used as they are, and an increase in cost resulting from a new layout design can be suppressed.

Figure 21:
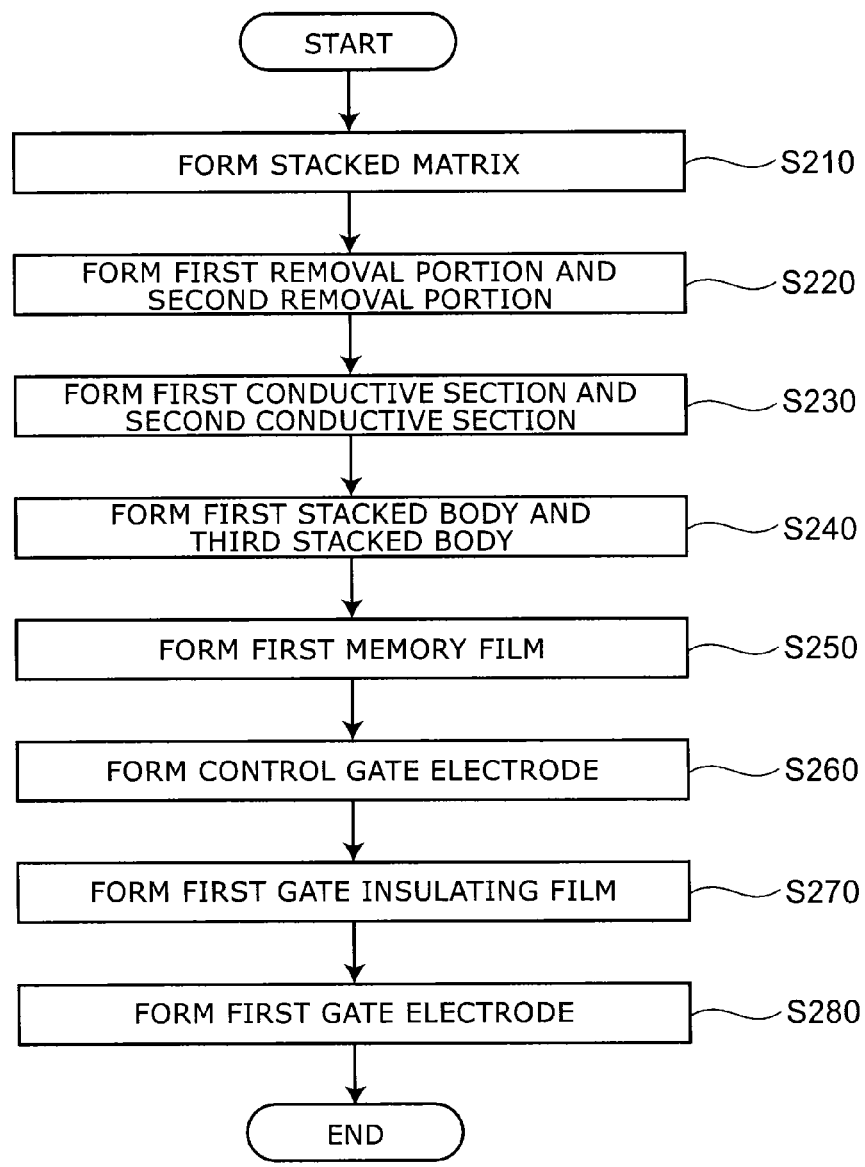
FIG. 21 is a flow chart showing the method for manufacturing the semiconductor device according to the fifth embodiment.

FIG. 21 is a flow chart illustrating the method for manufacturing the semiconductor device according to the fifth embodiment.

As shown in FIG. 21, the method for manufacturing the semiconductor device 160 includes step S210 that forms the stacked matrix 40, step S220 that forms the first removal portion 32 and the second removal portion 33, step S230 that forms the first conductive section 21 and the second conductive section 22, step S240 that forms the first stacked body 20 and the third stacked body 172, step S250 that forms the first memory film 179, step S260 that forms the control gate electrode 175, step S270 that forms the first gate insulating film 24, and step S280 that forms the first gate electrode 23. Thereby, the semiconductor device 160 with improved characteristics can be manufactured without increasing the footprint.

In step S210, for example, the process described in regard to FIG. 2A is performed. In step S220, for example, the process described in regard to FIG. 16A and FIG. 16B is performed. In step S230, for example, the process described in regard to FIG. 17A and FIG. 17B is performed. In step S240, for example, the process described in regard to FIG. 18A and FIG. 18B is performed. In step S250 and step S260, for example, the process described in regard to FIG. 19A to FIG. 19C is performed. In step S270 and step S280, for example, the process described in regard to FIG. 20A to FIG. 20C is performed.

The order of steps S210 to S280 is arbitrary. For example, step S250 and step S260 may be performed after step S280. That is, the control gate electrode 175 and the first memory film 179 may be formed after the first gate electrode 23 and the first gate insulating film 24 are formed.

Figure 22A:
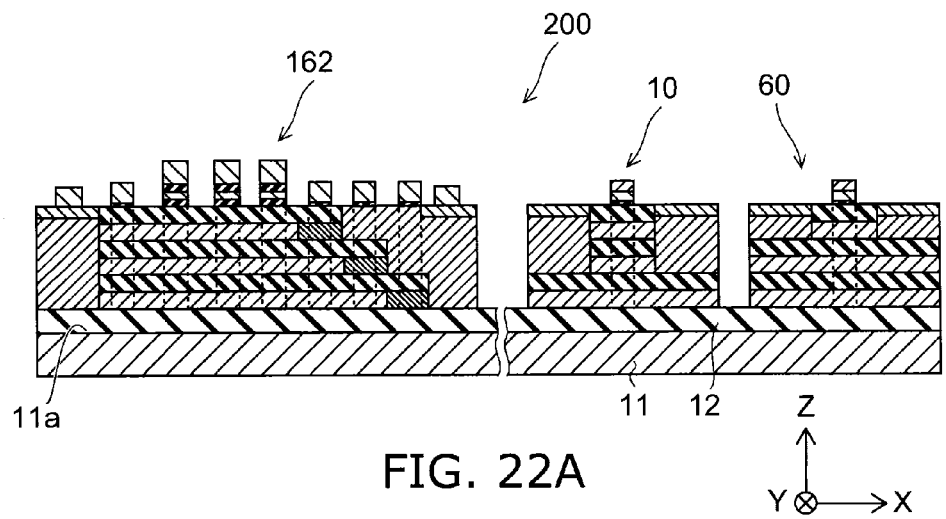
FIG. 22A and FIG. 22B are schematic cross-sectional views showing another semiconductor device according to the fifth embodiment.
Figure 22B:
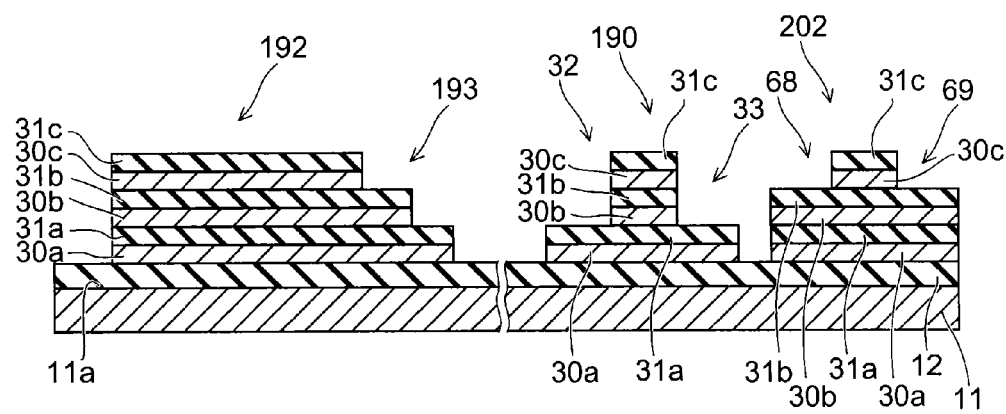

FIG. 22A and FIG. 22B are schematic cross-sectional views illustrating another semiconductor device according to the fifth embodiment.

FIG. 22A and FIG. 22B are cross-sectional views corresponding to a cross section taken along line 11-12 of FIG. 15A.

As shown in FIG. 22A, in another semiconductor device 200 according to the embodiment, the first transistor 10 and the second transistor 60 described in regard to the second embodiment and the first memory unit 162 described in regard to the fifth embodiment are provided on the major surface 11a of the substrate 11. In this example, in the first transistor 10 and the second transistor 60, the number of first semiconductor layers 25 which are connected to the first conductive section 21 and the second conductive section 22 is twice the number of second semiconductor layers 66 which are connected to the third conductive section 62 and the fourth conductive section 63. The first transistor 10 is p type, and the second transistor 60 is n type.

When the semiconductor device 200 is manufactured, for example, the interlayer insulating film 12 is formed on the substrate 11, and the stacked matrix 40 is formed thereon (see FIG. 2A).

As shown in FIG. 22B, parts of the stacked matrix 40 are removed, and the first transistor matrix 190 corresponding to the first transistor 10, the first memory matrix 192 corresponding to the first memory unit 162, and a second transistor matrix 202 corresponding to the second transistor 60 are formed from the stacked matrix 40.

In the formation of the first transistor matrix 190, the first memory matrix 192, and the second transistor matrix 202, the first removal portion 32 and the second removal portion 33 of the first transistor 10, the third removal portion 68 and the fourth removal portion 69 of the second transistor 60, and the stair portion 193 of the first memory unit 162 can be formed simultaneously.

More specifically, in regard to the first transistor matrix 190, when the first removal portion 32 and the second removal portion 33 are formed, the semiconductor film 30b of the first memory matrix 192 is shaped. In regard to the second transistor matrix 202, when the third removal portion 68 and the fourth removal portion 69 are formed, the semiconductor film 30c of the first memory matrix 192 is shaped.

In the following, the first transistor 10, the second transistor 60, and the first memory unit 162 are formed by a similar sequence to the fifth embodiment mentioned above.

Thus, in the semiconductor device 200, when the first transistor 10 of the p type, the second transistor 60 of the n type, and the first memory unit 162 are formed on the major surface 11a of the substrate 11, the process of etching can be shared. Thereby, the number of manufacturing processes and process costs can be significantly reduced.

Figure 23:
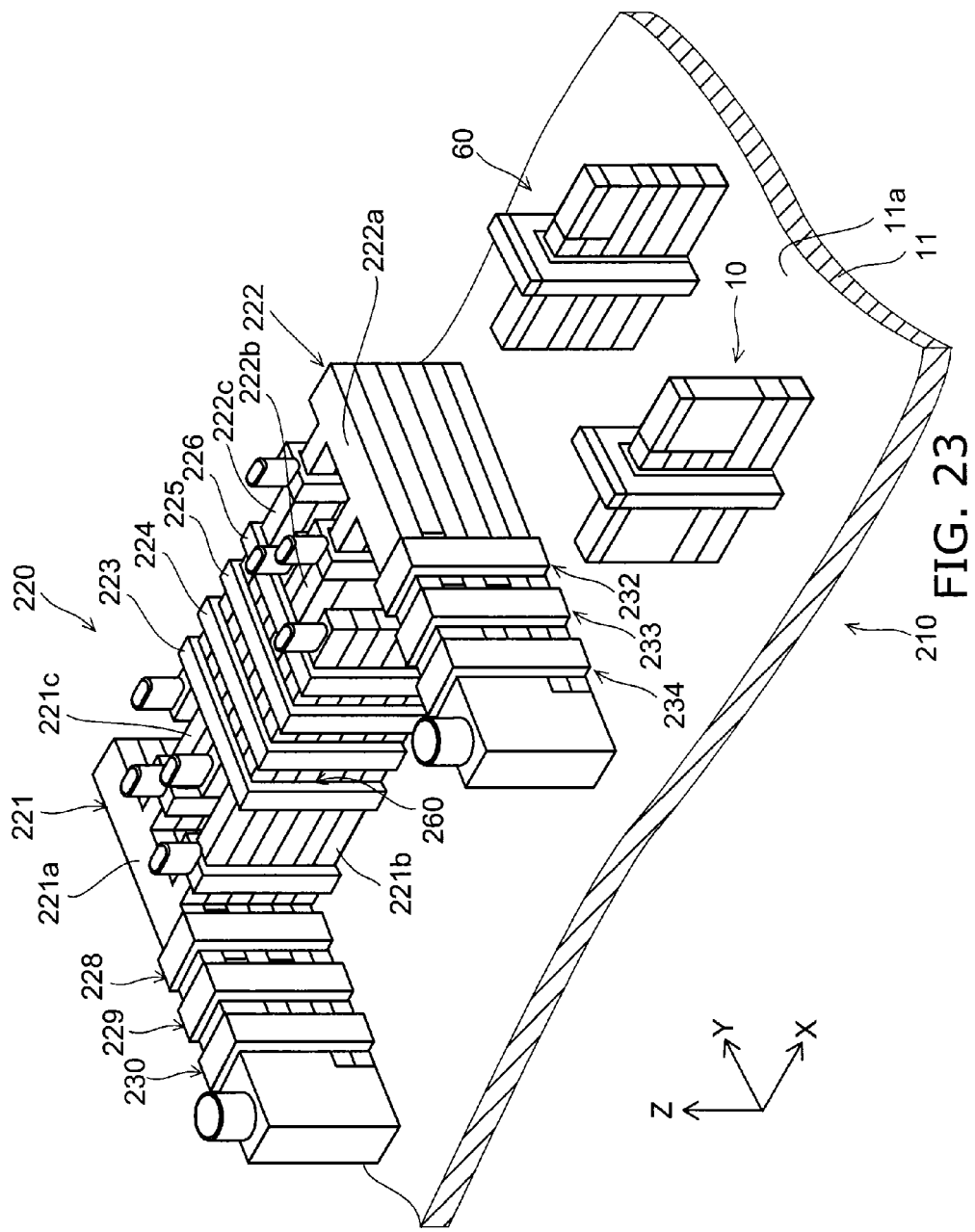
FIG. 23 is a schematic perspective view showing another semiconductor device according to the fifth embodiment.

FIG. 23 is a schematic perspective view illustrating another semiconductor device according to the fifth embodiment.

As shown in FIG. 23, another semiconductor device 210 according to the embodiment includes the first transistor 10, the second transistor 60, and a memory unit 220. The first transistor 10, the second transistor 60, and the memory unit 220 are provided on the major surface 11a of the substrate 11.

The memory unit 220 includes two stacked bodies 221 and 222. The stacked body 221 includes a main body portion 221a, and a first extension portion 221b and a second extension portion 221c extending in the X-Y plane from the main body portion 221a. The stacked body 222 includes a main body portion 222a, and a first extension portion 222b and a second extension portion 222c extending in the X-Y plane from the main body portion 222a. In the stacked bodies 221 and 222, three semiconductor layers and three insulating layers are alternately stacked in the Z-axis direction similarly to the semiconductor device 200.

The main body portions 221a and 222a have a substantially rectangular parallelepiped shape. The main body portions 221a and 222a are disposed substantially parallel to each other.

In the stacked body 221, the spacing between the first extension portion 221b and the second extension portion 221c is, for example, wider than the width in the Y-axis direction (the extending direction of the main body portion 221a) of the first extension portion 221b and the second extension portion 221c.

In the stacked body 222, the spacing between the first extension portion 222b and the second extension portion 222c is, for example, wider than the width in the Y-axis direction of the first extension portion 222b and the second extension portion 222c.

The first extension portion 221c of the stacked body 221 is located between the first extension portion 222b and the second extension portion 222c of the stacked body 222. The first extension portion 222b of the stacked body 222 is located between the first extension portion 221b and the second extension portion 221c of the stacked body 221. In the memory unit 220, the two stacked bodies 221 and 222 are disposed such that the first extension portions 221b and 222b are paired and the second extension portions 221c and 222c are paired.

In the memory unit 220, four control gate electrodes, that is, a first to a fourth control gate electrode 223 to 226 are provided. The first control gate electrode 223 to the fourth control gate electrode 226 are opposed to the upper surface of each of the first extension portions 221b and 222b and the second extension portions 221c and 222c. The first control gate electrode 223 to the fourth control gate electrode 226 are opposed to two side surfaces perpendicular to the Y-axis direction of each of the first extension portions 221b and 222b and the second extension portions 221c and 222c. The first control gate electrode 223 to the fourth control gate electrode 226 are opposed to the side surfaces of the semiconductor layers included in the first extension portions 221b and 222b and the second extension portions 221c and 222c.

A memory film 260 is provided between the first control gate electrode 223 to the fourth control gate electrode 226 and the first extension portions 221b and 222b. The memory film 260 is provided also between the first control gate electrode 223 to the fourth control gate electrode 226 and the second extension portions 221c and 222c.

The memory film 260 includes, for example, an outer insulating film (e.g. the first outer insulating film 176), a charge storage layer (e.g. the first charge storage layer 177), and an inner insulating film (e.g. the first inner insulating film 178). In the memory unit 220, portions opposed to the first control gate electrode 223 to the fourth control gate electrode 226 of the first extension portions 221b and 222b and the second extension portions 221c and 222c each function as a memory cell.

The main body portion 221a includes first to third layer select transistors 228 to 230. The main body portion 222a includes fourth to sixth layer select transistors 232 to 234.

Also in the memory unit 220, when the stair-shaped portions of the first to third layer select transistors 228 to 230 and the fourth to sixth layer select transistors 232 to 234 are formed, the first removal portion 32 and the second removal portion 33 of the first transistor 10 and the third removal portion 68 and the fourth removal portion 69 of the second transistor 60 can be formed simultaneously.

Therefore, in the semiconductor device 210, the number of manufacturing processes and process costs can be significantly reduced. Furthermore, the stacked bodies 221 and 222 of the memory unit 220 can be formed from the same stacked matrix 40 as in forming the first stacked body 20 of the first transistor 10 and the second stacked body 61 of the second transistor 60. Thus, in the semiconductor device 210, high performance can be obtained in the memory unit 220.

FIG. 24A to FIG. 24D are schematic cross-sectional views illustrating another semiconductor device according to the fifth embodiment.

FIG. 24A and FIG. 24C are cross-sectional views corresponding to a cross section taken along line J1-J2 of FIG. 15A. FIG. 24B and FIG. 24D are cross-sectional views corresponding to a cross section taken along line A1-A2 of FIG. 1B.

As shown in FIG. 24B, in this example, a high concentration region 250 opposed to the first semiconductor layer 25b and the first semiconductor layer 25c (a part of the first semiconductor layers 25p) and a low concentration region 252 opposed to the first semiconductor layer 25a (the first semiconductor layer 25 excluding the part of the first semiconductor layers 25p) and having a lower impurity concentration than the high concentration region 250 are provided in the first gate electrode 23 of the first transistor 10. The concentration of the impurity of the high concentration region 250 is, for example, $10^{20}$ cm$^{-3}$ or more. The concentration of the impurity of the low concentration region 252 is, for example, less than $10^{20}$ cm$^{-3}$.

Thereby, appropriate operations are obtained, and the operating speed is improved.

As shown in FIG. 24A, for example, a high concentration region 254 is provided in the control gate electrode 175 of the first memory string 163. The high concentration region 254 is opposed to each of the third semiconductor layer 173a to the third semiconductor layer 173c. The impurity concentration of the high concentration region 254 is, for example, $10^{20}$ cm$^{-3}$ or more. Although not shown in the drawing, a high concentration region opposed to each of the third semiconductor layer 173a to the third semiconductor layer 173c is provided also in the control gate electrodes 175 of the second memory string 164 and the third memory string 165, the gate electrodes 180 of the first to third layer select transistors 166 to 168, and the gate electrode 182 of the source-side select gate transistor 170.

Thereby, in the first memory unit 162, the controllability of the control gate electrode 175 and the gate electrodes 180 and 182 to the channel is ensured. In the first memory unit 162, appropriate operations are obtained in the first to third memory strings 163 to 165, the first to third layer select transistors 166 to 168, and the source-side select gate transistor 170.

As shown in FIG. 24D, when the high concentration region 250 and the low concentration region 252 of the first gate electrode 23 are manufactured, for example, a third ion implantation IM3 is performed from above the first gate electrode 23. The absolute value of the angle between the implantation direction of the third ion implantation IM3 and the Z-axis direction is set not less than 0 degrees and less than 7 degrees, for example. After that, heat treatment is performed to diffuse the implanted impurity. Thereby, the impurity is introduced into a portion of the first gate electrode 23 opposed to the first semiconductor layers 25b and 25c. The portion doped with the impurity forms the high concentration region 250, and the portion not doped with the impurity forms the low concentration region 252. The implantation angle, acceleration voltage, and dose of the third ion implantation IM3, and the conditions of the heat treatment after the third ion implantation IM3 are appropriately adjusted in accordance with the number of semiconductor layers where an impurity is to be diffused and the number of insulating layers.

As shown in FIG. 24C, when the high concentration region 254 of the control gate electrode 175 of the first memory unit 162 is fabricated, a fourth ion implantation IM4 is performed from above the control gate electrode 175. The absolute value of the angle between the implantation direction of the fourth ion implantation IM4 and the Z-axis direction is set not less than 7 degrees and not more than 45 degrees, for example. The impurity is introduced into the entire side surface portion of the control gate electrode 175. Thereby, the high concentration region 254 opposed to all of the third semiconductor layer 173a to the third semiconductor layer 173c can be formed.

Sixth Embodiment

Figure 25A:
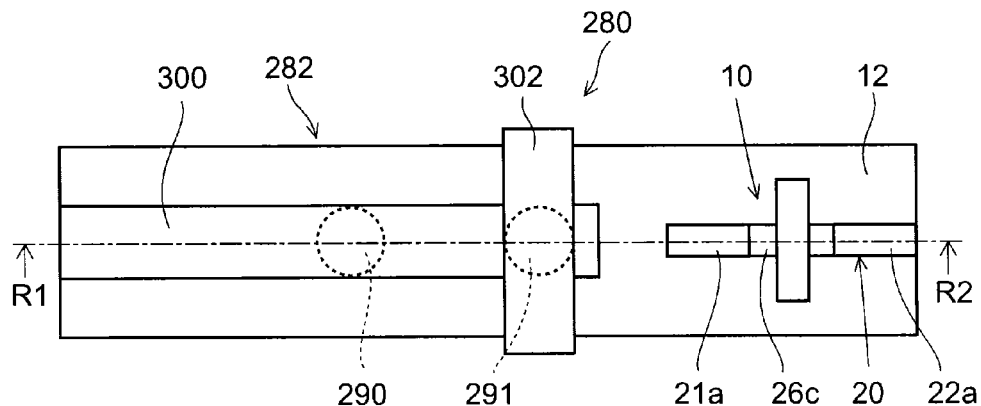
FIG. 25A and FIG. 25B are schematic views showing a semiconductor device according to a sixth embodiment.
Figure 25B:
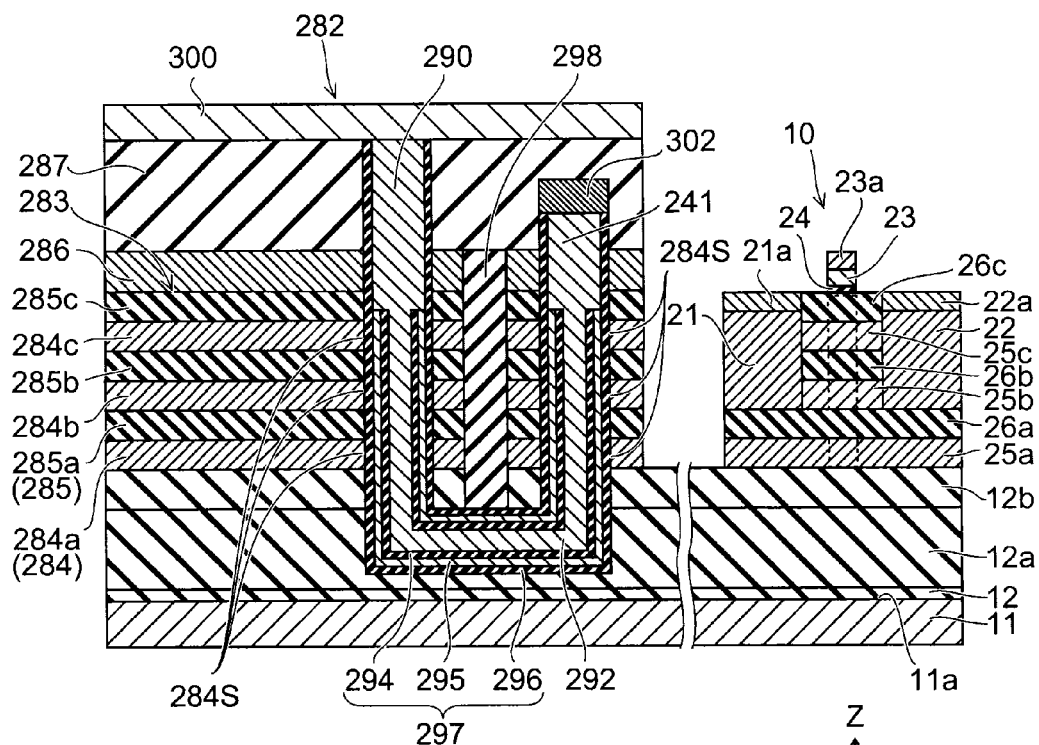

FIG. 25A and FIG. 25B are schematic views illustrating a semiconductor device according to a sixth embodiment.

FIG. 25A is a schematic top view, and FIG. 25B is a schematic cross-sectional view. FIG. 25B schematically shows a cross section taken along line R1-R2 of FIG. 25A.

As shown in FIG. 25A and FIG. 25B, a semiconductor device 280 according to the embodiment further includes a second memory unit 282 (a memory unit) in addition to the first transistor 10. The first transistor 10 and the second memory unit 282 are provided on the major surface 11a of the substrate 11. In this example, the interlayer insulating film 12 is provided on the major surface 11a, a connection portion conductive layer 12a is provided on the interlayer insulating film 12, and an interlayer insulating film 12b is provided on the connection portion conductive layer 12a.

The second memory unit 282 is a vertical channel memory. The first transistor 10 functions as, for example, a peripheral circuit of the second memory unit 282.

The second memory unit 282 includes a fourth stacked body 283. The fourth stacked body 283 includes a plurality of fourth semiconductor layers 284a to 284c and a plurality of fourth insulating layers 285a to 285c alternately stacked along the Z-axis direction. The fourth semiconductor layers 284a to 284c are collectively referred to as a fourth semiconductor layer 284. The fourth insulating layers 285a to 285c are collectively referred to as a fourth insulating layer 285. For the fourth semiconductor layer 284, for example, a conductive semiconductor such as polysilicon doped with an impurity is used. The fourth semiconductor layer 284 functions as a control gate electrode.

The fourth stacked body 283 extends along a fifth direction perpendicular to the Z-axis direction. In this example, the fifth direction is the X-axis direction. However, the fifth direction may be an arbitrary direction perpendicular to the Z-axis direction. Although the second direction of the first transistor 10 is parallel to the fifth direction of the second memory unit 282 in this example, the second direction may be intersecting the fifth direction.

A select gate electrode 286 is provided on the fourth insulating layer 285c. An interlayer insulating film 287 is provided on the select gate electrode 286. The second memory unit 282 further includes a first semiconductor pillar 290 and a second semiconductor pillar 291. The first semiconductor pillar 290 penetrates through the interlayer insulating film 12, the fourth stacked body 283, the select gate electrode 286, and the insulating film 287 along the Z-axis direction. The first semiconductor pillar 290 is opposed to the side surface 284s of each of the fourth semiconductor layers 284.

The second semiconductor pillar 291 penetrates through the interlayer insulating film 12, the fourth stacked body 283, and the select gate electrode 286 along the Z-axis direction.

The second semiconductor pillar 291 is further provided in a part of the interlayer insulating film 287. The second semiconductor pillar 291 is opposed to the side surface 284s of each of the fourth semiconductor layers 284.

The first semiconductor pillar 290 and the second semiconductor pillar 291 are connected to each other via a connection semiconductor layer 292 provided in the connection portion conductive layer 12a. Polysilicon, for example, is used for the first semiconductor pillar 290, the second semiconductor pillar 291, and the connection semiconductor layer 292. Polysilicon, for example, is used for the connection portion conductive layer 12a.

The second memory unit 282 further includes a second memory film 297. The second memory film 297 includes a second inner insulating film 294, a second charge storage layer 295, and a second outer insulating film 296. The second inner insulating film 294 has a cylindrical shape covering the peripheries of the first semiconductor pillar 290, the second semiconductor pillar 291, and the connection semiconductor layer 292. The second charge storage layer 295 has a cylindrical shape covering the periphery of the second inner insulating film 294. The second outer insulating film 296 has a cylindrical shape covering the periphery of the second charge storage layer 295.

The second outer insulating film 296 is provided between the first semiconductor pillar 290 and the fourth stacked body 283. The second charge storage layer 295 is provided between the first semiconductor pillar 290 and the second outer insulating film 296. The second inner insulating film 294 is provided between the first semiconductor pillar 290 and the second charge storage layer 295. The second outer insulating film 296 is provided also between the second semiconductor pillar 291 and the fourth stacked body 283. The second charge storage layer 295 is provided also between the second semiconductor pillar 291 and the second outer insulating film 296. The second inner insulating film 294 is provided also between the second semiconductor pillar 291 and the second charge storage layer 295. The second outer insulating film 296 may be provided only in a portion opposed to the side surface 284s of each of the fourth semiconductor layers 284.

In the second memory unit 282, a portion of the first semiconductor pillar 290 opposed to the side surface 284s of each of the fourth semiconductor layers 284 and a portion of the second semiconductor pillar 291 opposed to the side surface 284s of each of the fourth semiconductor layers 284 each function as a memory cell.

Thus, the second memory film 297 forms a memory cell that stores information together with the fourth semiconductor layer 284, the first semiconductor pillar 290, and the second semiconductor pillar 291. The second memory film 297 may include a still larger number of films or layers and may be configured arbitrarily; the second memory film 297 needs only to be capable of forming a memory cell.

An interlayer insulating film 298 is provided between the first semiconductor pillar 290 and the second semiconductor pillar 291. The interlayer insulating film 298 electrically divides the memory cell formed of the fourth semiconductor layer 284 and the first semiconductor pillar 290 and the memory cell formed of the fourth semiconductor layer 284 and the second semiconductor pillar 291. A silicon oxide film, for example, is used as the interlayer insulating film 298.

A bit line 300 is provided on the interlayer insulating film 287. The bit line 300 is electrically connected to the first semiconductor pillar 290. A source line 302 extending in the Y-axis direction, for example, is provided in the interlayer insulating film 287. The source line 302 is electrically connected to the second semiconductor pillar 291.

FIG. 26A and FIG. 26B and FIG. 27A to FIG. 27C are schematic cross-sectional views illustrating a method for manufacturing the semiconductor device according to the sixth embodiment.

FIG. 26A and FIG. 26B and FIG. 27A to FIG. 27C schematically show a cross section taken along line R1-R2 of FIG. 25A.

Figure 26A:
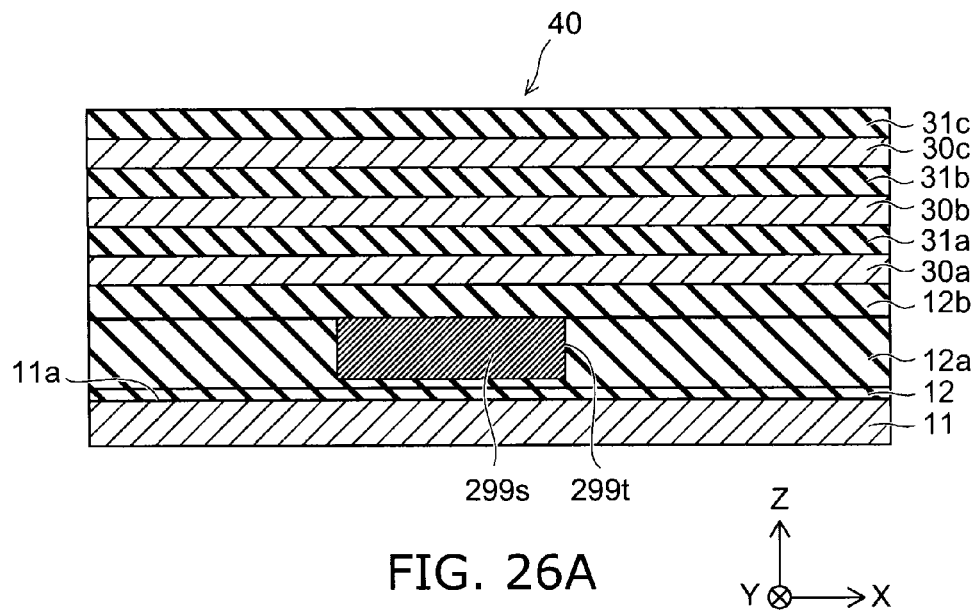
FIG. 26A and FIG. 26B are schematic cross-sectional views showing a method for manufacturing the semiconductor device according to the sixth embodiment.

As shown in FIG. 26A, when the semiconductor device 280 is manufactured, for example, the interlayer insulating film 12 is formed on the substrate 11, and the connection portion conductive layer 12a is formed thereon. A trench 299t is formed in a portion of the connection portion conductive layer 12a where the connection semiconductor layer 292 will be provided, and a sacrificial layer 299s is buried in the trench 299t. Silicon nitride, for example, is used for the sacrificial layer 299s. The surface is planaized, and the interlayer insulating film 12b is formed on the connection portion conductive layer 12a and the sacrificial layer 299s. After that, the stacked matrix 40 is formed on the interlayer insulating film 12b.

Figure 26B:
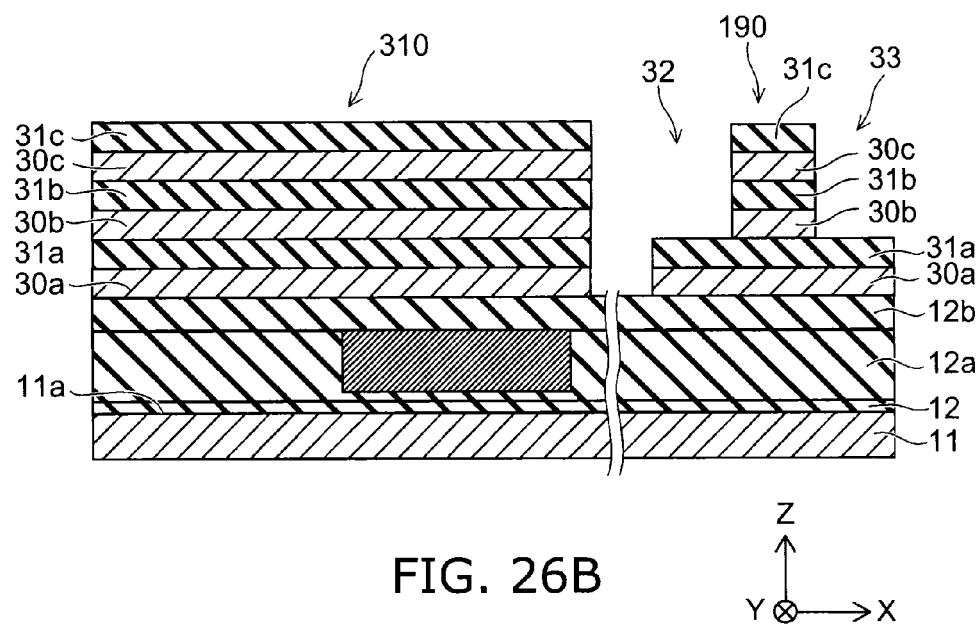

As shown in FIG. 26B, parts of the stacked matrix 40 are removed, and the first transistor matrix 190 corresponding to the first transistor 10 and a second memory matrix 310 corresponding to the second memory unit 282 are formed from the stacked matrix 40.

As shown in FIG. 27A, the select gate electrode 286 is formed on the insulating film 31c of the second memory matrix 310. After the select gate electrode 286 is formed, the interlayer insulating film 298 is formed in a position corresponding to between the first semiconductor pillar 290 and the second semiconductor pillar 291 in the second memory matrix 310 and the select gate electrode 286. Then, a layer that forms a part of the interlayer insulating film 287 is formed on the select gate electrode 286.

Further, a first through hole 312 penetrating through the interlayer insulating film 287, the select gate electrode 286, and the second memory matrix 310 along the Z-axis direction is formed in a position corresponding to the first semiconductor pillar 290. The first through hole 312 has an inner surface 312a along the Z-axis direction. A second through hole 314 penetrating through the interlayer insulating film 287, the select gate electrode 286, and the second memory matrix 310 along the Z-axis direction is formed in a position corresponding to the second semiconductor pillar 291. The second through hole 314 has an inner surface 314a along the Z-axis direction. The fourth stacked body 283 is formed of the second memory matrix 310. The first through hole 312 and the second through hole 314 are formed simultaneously, for example. At this time, the sacrificial layer 299s is removed. The first through hole 312 and the second through hole 314 are connected through the trench 299t.

As shown in FIG. 27B, the second memory film 297 is formed on the inner surface 312a of the first through hole 312 and the inner surface 314a of the second through hole 314. For example, the second outer insulating film 296, the second charge storage layer 295, and the second inner insulating film 294 are formed in this order on the inner surfaces 312a and 314a.

As shown in FIG. 27C, after the second memory film 297 is processed into a prescribed shape, a semiconductor material is buried in a remaining space 312b of the first through hole 312 to form the first semiconductor pillar 290. Further, a semiconductor material is buried in a remaining space 314b of the second through hole 314 to form the second semiconductor pillar 291.

After that, the source line 302 is formed in contact with one end of the second semiconductor pillar 291. After the source line 302 is formed, a layer that forms the interlayer insulating film 287 is formed. The bit line 300 is formed on the interlayer insulating film 287. Thus, the second memory unit 282 is formed. Then, the first transistor 10 is formed by a similar sequence to the semiconductor device 160; thereby, the semiconductor device 280 is completed.

Thus, also in the semiconductor device 280, some processes can be shared between the formation of the fourth stacked body 283 and the formation of the first stacked body 20 of the first transistor 10. Also the semiconductor device 280 according to the embodiment can significantly reduce the number of manufacturing processes and process costs similarly to the semiconductor device 160 according to the fifth embodiment mentioned above. Furthermore, high performance can be obtained in the second memory unit 282.

In the second memory unit 282, by increasing the number of the stacked layers in the fourth stacked body 283, which form control gate electrodes, the number of bits of memory can be increased without increasing the footprint of the second memory unit 282. Therefore, in the semiconductor device 280, the integration degree of the second memory unit 282 can be easily improved. Furthermore, costs can be reduced. Furthermore, in the second memory unit 282, the number of bits of memory can be further increased by increasing the number of semiconductor pillars.

Figure 28:
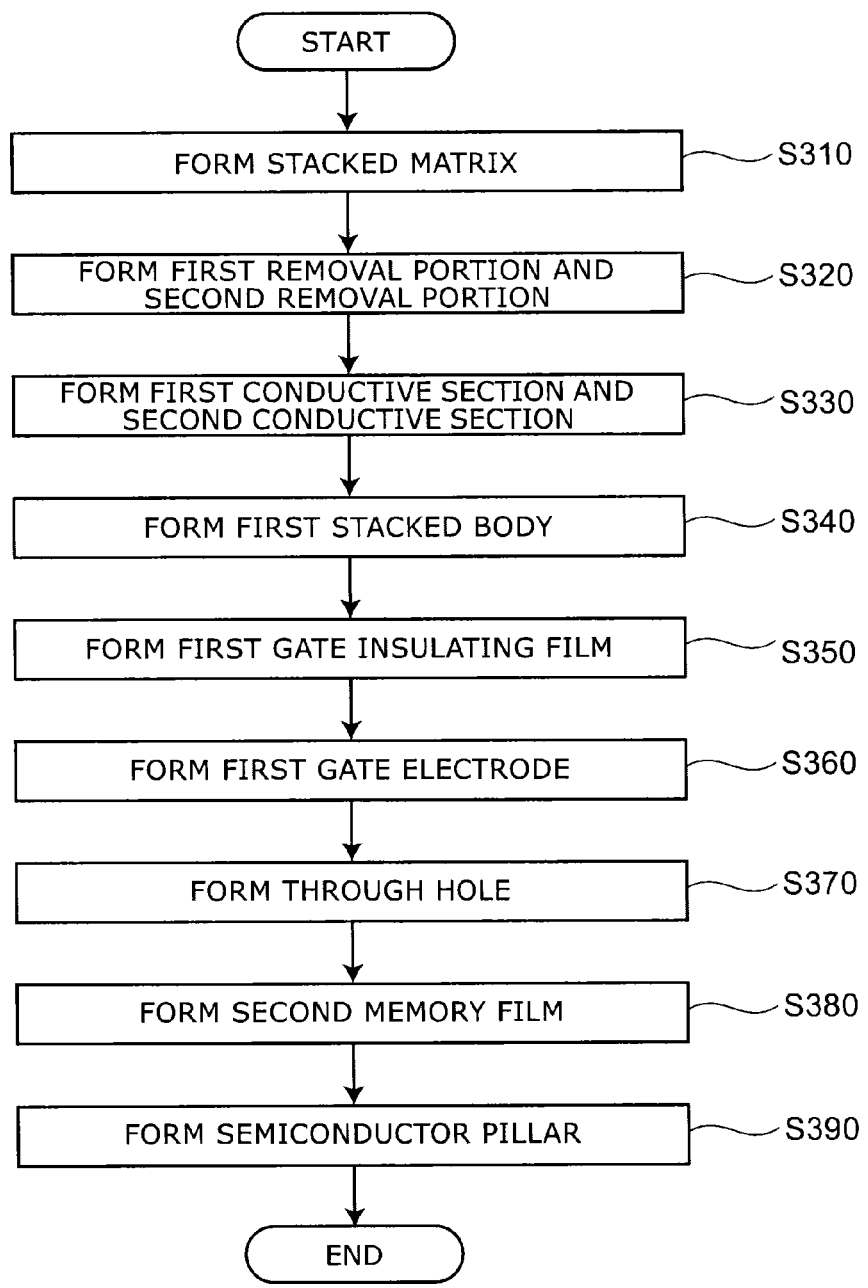
FIG. 28 is a flow chart showing the method for manufacturing the semiconductor device according to the sixth embodiment.

FIG. 28 is a flow chart illustrating the method for manufacturing the semiconductor device according to the sixth embodiment.

As shown in FIG. 28, the method for manufacturing the semiconductor device 280 includes step S310 that forms the stacked matrix 40, step S320 that forms the first removal portion 32 and the second removal portion 33, step S330 that forms the first conductive section 21 and the second conductive section 22, step S340 that forms the first stacked body 20, step S350 that forms the first gate insulating film 24, step S360 that forms the first gate electrode 23, step S370 that forms the first through hole 312 and the second through hole 314, step S380 that forms the second memory film 297, and step S390 that forms the first semiconductor pillar 290 and the second semiconductor pillar 291. Thereby, the semiconductor device 280 with improved characteristics can be manufactured without increasing the footprint.

In step S310, for example, the process described in regard to FIG. 26A is performed. In step S320, for example, the process described in regard to FIG. 26B is performed. In step S330, the process described in regard to FIG. 3A and FIG. 3B is performed. In step S340, the process described in regard to FIG. 4A and FIG. 4B is performed. In step S350 and step S360, for example, the process described in regard to FIG. 5A to FIG. 5C is performed. In step S370, for example, the process described in regard to FIG. 27A is performed. In step S380, for example, the process in regard to FIG. 27B is performed. In step S390, for example, the process described in regard to FIG. 27C is performed.

The order of steps S310 to S390 may be changed within the extent of technical feasibility, and may be performed simultaneously. For example, steps S370 to S390 may be performed after step S320. That is, after the first transistor matrix 190 and the second memory matrix 310 are formed from the stacked matrix 40, the second memory unit 282 may be formed after or before the formation of the first transistor 10. The formation of the first gate electrode 23 and the first gate insulating film 24 may be performed substantially simultaneously with the formation of the second memory film 297, for example. A part of the process of forming the first transistor 10 may be performed substantially simultaneously with a part of the process of forming the second memory unit 282.

The semiconductor device 280 may further include the second transistor 60. The second memory unit 282 and the first transistor 10 may be formed separately. In this case, an arbitrary conductive material may be used as the fourth semiconductor layer 284.

Although a vertical gate stacked memory and a vertical channel memory are illustrated as the memory unit in the embodiments mentioned above, the memory unit is not limited thereto. The memory unit may be, for example, a resistance change memory in which a resistance change layer and an electrode are stacked, or the like.

The embodiment provides a semiconductor device with improved characteristics and a method for manufacturing the same, without increasing the footprint.

Hereinabove, embodiments of the invention are described with reference to specific examples. However, the embodiment of the invention is not limited to these specific examples. For example, one skilled in the art may appropriately select specific configurations of components of semiconductor devices such as substrates, first transistors, first semiconductor layers, first insulating layers, first stacked bodies, first conductive sections, second conductive sections, first gate electrodes, first gate insulating films, second transistors, second semiconductor layers, second insulating layers, second stacked bodies, third conductive sections, fourth conductive sections, second gate electrodes, second gate insulating films, low concentration regions, high concentration regions, first memory units, third semiconductor layers, third insulating layers, third stacked bodies, control gate electrodes, first memory films, second memory units, fourth semiconductor layers, fourth insulating layers, fourth stacked bodies, semiconductor pillars, second memory films, first silicide portions, and first silicon portions from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a substrate having a major surface;
a first transistor provided on the major surface; and
a second transistor provided on the major surface,
the first transistor including:
- a first stacked body including a plurality of first semiconductor layers and a plurality of first insulating layers alternately stacked along a first direction perpendicular to the major surface, each of the first semiconductor layers having a side surface along the first direction;
- a first conductive section electrically connected to at least one of the first semiconductor layers;
- a second conductive section being apart from the first conductive section in a second direction perpendicular to the first direction and electrically connected to the at least one of the first semiconductor layers;
- a first gate electrode provided between the first conductive section and the second conductive section in the second direction and opposed to the side surface of each of the first semiconductor layers; and
- a first gate insulating film provided between the first gate electrode and the first semiconductor layers, the second transistor including:
- a second stacked body including a plurality of second semiconductor layers and a plurality of second insulating layers alternately stacked along the first direction, each of the second semiconductor layers having a side surface along the first direction, a number of the second semiconductor layers being same as a number of the first semiconductor layers;
- a third conductive section electrically connected to at least one of the second semiconductor layers;
- a fourth conductive section being apart from the third conductive section in a third direction perpendicular to the first direction and electrically connected to the at least one of the second semiconductor layers;
- a second gate electrode provided between the third conductive section and the fourth conductive section in the third direction and opposed to the side surface of each of the second semiconductor layers; and
- a second gate insulating film provided between the second gate electrode and the second semiconductor layers;

a number of the first semiconductor layers electrically connected to the first conductive section and the second conductive section being different from a number of the second semiconductor layers electrically connected to the third conductive section and the fourth conductive section.

2. The device according to claim 1, wherein
the first gate electrode includes
a high concentration region opposed to the at least one of the first semiconductor layers, and
a low concentration region opposed to the first semiconductor layers excluding the at least one of the first semiconductor layers out of the first semiconductor layers,
a concentration of an impurity of the low concentration region is lower than a concentration of an impurity of the high concentration region.

3. The device according to claim 2, wherein
the concentration of the impurity in the low concentration region is less than $10^{20}$ cm$^{-3}$ and
the concentration of the impurity in the high concentration region is $10^{20}$ cm$^{-3}$ or more.

4. The device according to claim 1, wherein a concentration of an impurity of a portion opposed to the gate electrode of the at least one of the first semiconductor layers is higher than a concentration of an impurity of a portion opposed to the gate electrode of the first semiconductor layers excluding the at least one of the first semiconductor layers out of the first semiconductor layers.

5. The device according to claim 4, wherein
the concentration of the impurity of the portion opposed to the gate electrode of the at least one of the first semiconductor layers is $10^{18}$ cm$^{-3}$ or more and
the concentration of the impurity of the portion opposed to the gate electrode of the first semiconductor layers excluding the at least one of the first semiconductor layers out of the first semiconductor layers is $10^{18}$ cm$^{-3}$ or less.

6. The device according to claim 1, further comprising:
a memory unit provided on the major surface,
the memory unit including:
- a third stacked body including a plurality of third semiconductor layers and a plurality of third insulating layers alternately stacked along the first direction, each of the third semiconductor layers having a side surface along the first direction;
- a control gate electrode opposed to the side surface of each of the third semiconductor layers; and
- a first memory film provided between the control gate electrode and the third semiconductor layers.

7. The device according to claim 6, wherein a concentration of an impurity of a portion of the control gate electrode opposed to the side surface of each of the third semiconductor layers is $10^{20}$ cm$^{-3}$ or more.

8. The device according to claim 1, further comprising:
a memory unit provided on the major surface,
the memory unit including:
- a fourth stacked body including a plurality of conductive layers and a plurality of fourth insulating layers alternately stacked along the first direction;
- a semiconductor pillar penetrating through the fourth stacked body along the first direction; and
- a second memory film provided between the semiconductor pillar and the fourth stacked body.

9. The device according to claim 1, wherein the first conductive section includes a first silicide portion and a first silicon portion, the first silicon portion being provided between the first silicide portion and the substrate.

10. The device according to claim 1, wherein the first semiconductor layers include silicon.

11. The device according to claim 6, wherein the control gate electrode includes an impurity of one of phosphorus, arsenic, and boron.

12. The device according to claim 1, wherein the first semiconductor layers include an impurity of one of phosphorus, arsenic, boron, and germanium.

13. The device according to claim 1, wherein the first gate insulating film is in contact with the first gate electrode and the first semiconductor layers.

* * * * *